(12) United States Patent
Sakuma et al.

(10) Patent No.: US 10,038,032 B2
(45) Date of Patent: Jul. 31, 2018

(54) SEMICONDUCTOR MEMORY DEVICE, SEMICONDUCTOR DEVICE, AND METHOD FOR MANUFACTURING THE SAME

(71) Applicant: Toshiba Memory Corporation, Minato-ku (JP)

(72) Inventors: Kiwamu Sakuma, Yokkaichi (JP); Shosuke Fujii, Kuwana (JP); Masumi Saitoh, Yokkaichi (JP); Toshiyuki Sasaki, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 1 day.

(21) Appl. No.: 15/062,672

(22) Filed: Mar. 7, 2016

(65) Prior Publication Data

US 2016/0268339 A1    Sep. 15, 2016

(30) Foreign Application Priority Data

Mar. 13, 2015 (JP) .................................. 2015-050524

(51) Int. Cl.
  *H01L 27/24* (2006.01)
  *H01L 29/66* (2006.01)
  *H01L 45/00* (2006.01)
(52) U.S. Cl.
  CPC ........ *H01L 27/249* (2013.01); *H01L 27/2454* (2013.01); *H01L 29/66666* (2013.01); *H01L 45/085* (2013.01); *H01L 45/1226* (2013.01); *H01L 45/145* (2013.01); *H01L 45/146* (2013.01)

(58) Field of Classification Search
  CPC .......................... H01L 27/2454; H01L 27/249
  See application file for complete search history.

(56) References Cited

U.S. PATENT DOCUMENTS

| 7,910,435 B2 | 3/2011 | Rhie |
| 9,076,879 B2 | 7/2015 | Yoo et al. |
| 9,196,654 B2 * | 11/2015 | Boivin .............. H01L 29/66825 |
| 9,246,088 B2 | 1/2016 | Yamato et al. |

(Continued)

FOREIGN PATENT DOCUMENTS

| JP | 2007-19559 | 1/2007 |
| JP | 2007-201454 | 8/2007 |

(Continued)

*Primary Examiner* — Mark Prenty
(74) *Attorney, Agent, or Firm* — Oblon, McClelland, Maier & Neustadt, L.L.P.

(57) ABSTRACT

According to one embodiment, a semiconductor memory device includes a plurality of first wirings, second wirings, a plurality of memory cells, selection gate transistors, and a third wiring. The first wirings are disposed in a first direction along a surface of a substrate and in a second direction intersecting with the surface of the substrate. The selection gate transistors are connected to respective one ends of the second wirings. The third wiring is connected in common to one end of the selection gate transistors. The selection gate transistor includes first to third semiconductor layers laminated on the third wiring and a gate electrode. The gate electrode is opposed to the second semiconductor layer in the first direction. The second semiconductor layer has a length in the first direction smaller than lengths of the first semiconductor layer and the third semiconductor layer in the first direction.

22 Claims, 27 Drawing Sheets

(56) References Cited

U.S. PATENT DOCUMENTS

| | | |
|---|---|---|
| 2009/0004861 A1 | 1/2009 | Lee et al. |
| 2011/0316063 A1 | 12/2011 | Tang et al. |
| 2013/0308363 A1 | 11/2013 | Scheuerlein et al. |
| 2013/0339571 A1 | 12/2013 | Cernea et al. |
| 2014/0209853 A1* | 7/2014 | Yamato ............... H01L 45/1226 257/5 |
| 2015/0062993 A1 | 3/2015 | Tanaka |
| 2015/0103582 A1 | 4/2015 | Okawa et al. |

FOREIGN PATENT DOCUMENTS

| | | |
|---|---|---|
| JP | 2009-10314 | 1/2009 |
| JP | 2013-533628 | 8/2013 |
| JP | 2014-57067 | 3/2014 |
| JP | 2014-150236 | 8/2014 |
| JP | 2015-50456 | 3/2015 |
| WO | WO 2004/021445 A1 | 3/2004 |

* cited by examiner

SEMICONDUCTOR MEMORY DEVICE, SEMICONDUCTOR DEVICE, AND METHOD FOR MANUFACTURING THE SAME

CROSS REFERENCE TO RELATED APPLICATIONS

This application is based on and claims the benefit of priority from prior Japanese Patent Application No. 2015-050524, filed on Mar. 13, 2015, the entire contents of which are incorporated herein by reference.

FIELD

Embodiments described herein relate generally to a semiconductor memory device, a semiconductor device, and methods for manufacturing the semiconductor memory device and the semiconductor device.

BACKGROUND

Recently, there has been proposed a Resistive RAM (ReRAM) that uses variable resistive elements, which reversibly change a resistance value, as a memory. Such ReRAM includes bit lines, word lines intersecting with the bit lines, and memory cells connected to the bit lines and the word lines. Here, the following structure has been proposed. The bit lines are formed to extend in a direction perpendicular to a substrate. Along the bit lines, the memory cells are formed. For example, in such structure, a selection transistor is connected to one end of each bit line. Via this selection transistor, a predetermined bit line is selectively connected to a global bit line.

DETAILED DESCRIPTION

A semiconductor memory device according to one embodiment includes a plurality of first wirings, a plurality of second wirings, a plurality of memory cells, a plurality of selection gate transistors, and a third wiring. The plurality of first wirings are disposed in a first direction along a surface of a substrate and in a second direction intersecting with the surface of the substrate. The plurality of first wirings extend in a third direction intersecting with the first direction and the second direction. The plurality of second wirings are disposed in the first direction. The plurality of second wirings extend in the second direction. The plurality of second wirings intersect with the plurality of first wirings. The plurality of memory cells are disposed at portions where the plurality of first wirings intersect with the plurality of second wirings. The plurality of selection gate transistors are connected to respective one ends of the plurality of second wirings. The third wiring is connected in common to one end of the plurality of selection gate transistors. The selection gate transistor includes a first semiconductor layer, a second semiconductor layer, and a third semiconductor layer laminated in the order on the third wiring and a gate electrode. The gate electrode is opposed to the side surface of the second semiconductor layer in the first direction. The second semiconductor layer has a length in the first direction smaller than lengths of the first semiconductor layer and the third semiconductor layer in the first direction.

[First Embodiment]
[Structure]

Figure 1:
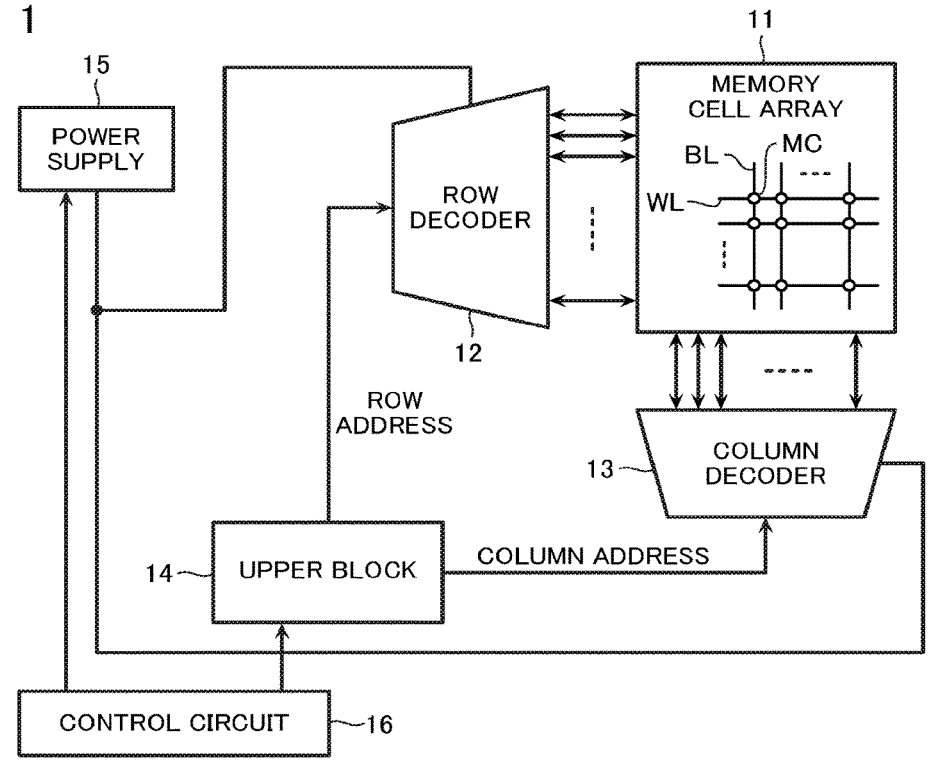
FIG. 1 is a block diagram of a semiconductor memory device according to a first embodiment.

First, the following describes an overall structure of a semiconductor memory device according to the first embodiment. FIG. 1 is an exemplary block diagram of the semiconductor memory device according to the first embodiment. As illustrated in FIG. 1, the semiconductor memory device includes a memory cell array 11, a row decoder 12, a column decoder 13, an upper block 14, a power supply 15, and a control circuit 16.

The memory cell array 11 includes a plurality of word lines WL and bit lines BL, which intersect with one another, and memory cells MC, which are disposed in the respective intersecting portions of these lines. The row decoder 12 selects the word line WL for access (data erasure/writing/reading). The column decoder 13 includes a driver that selects the bit line BL for access to control an access operation.

The upper block 14 selects the memory cell MC in the memory cell array 11 to be accessed. The upper block 14 gives a row address and a column address to the row decoder 12 and the column decoder 13, respectively. The power supply 15 generates combinations of predetermined voltages corresponding to the respective operations of data erasure/writing/reading and supplies the voltages to the row decoder 12 and the column decoder 13. The control circuit 16 performs a control such as transmission of an address to the upper block 14 in response to an external command and controls the power supply 15.

Figure 2:
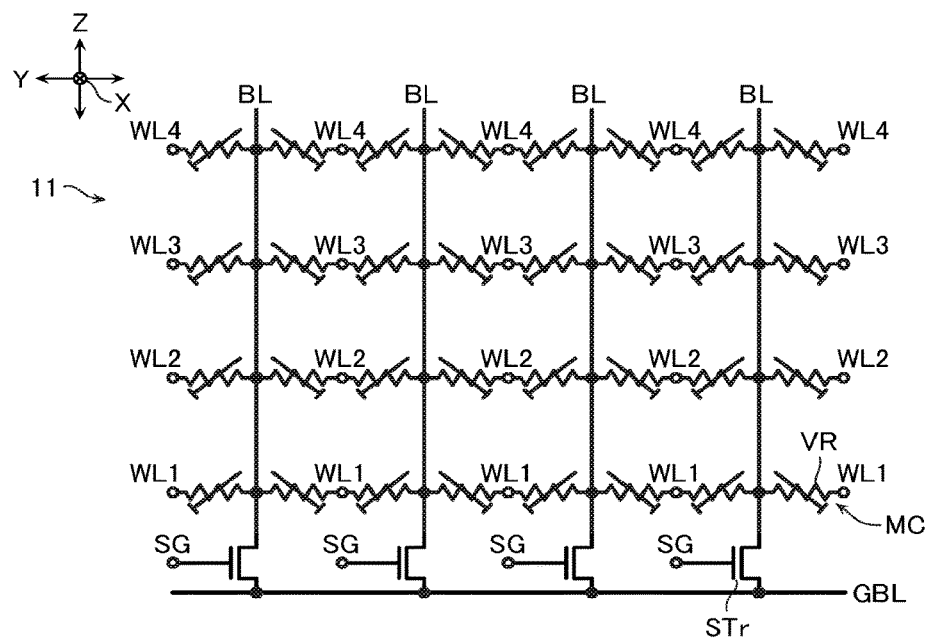
FIG. 2 is a circuit diagram illustrating a part of a structure of the semiconductor memory device.

The following describes the memory cell array 11 according to the first embodiment in detail with reference to FIG. 2. FIG. 2 is an exemplary circuit diagram of the memory cell array 11. In FIG. 2, the X direction, the Y direction, and the Z direction are mutually orthogonal. The X direction is a direction the perpendicular to the paper. The structures illustrated in FIG. 2 are continuously disposed in the X direction.

As illustrated in FIG. 2, the memory cell array 11 includes selection gate transistors STr, global bit lines GBL, and selection gate lines SG in addition to the above-described word lines WL (WL1 to WL4), bit lines BL, and memory cells MC.

As illustrated in FIG. 2, the word lines WL1 to WL4 are disposed in the Z direction at predetermined pitches and extend in the X direction. The bit lines BL are disposed in a matrix in the X direction and the Y direction and extend in the Z direction. The memory cells MC are disposed at portions where these word lines WL and bit lines BL intersect. Accordingly, the memory cells MC are disposed in a three-dimensional matrix, the X, Y, and Z directions.

As illustrated in FIG. 2, the memory cell MC includes a variable resistive element VR. When the resistance value of the variable resistive element VR changes between a high resistance state and a low resistance state based on an applied voltage, the memory cell MC stores data in a non-volatile manner based on the resistance value.

The variable resistive element VR changes from the high resistance state (a reset state) to the low resistance state (a setting state) by a setting operation. The setting operation applies a voltage at a certain magnitude or more to both ends of the variable resistive element VR. The variable resistive element VR changes from the low resistance state (the setting state) to the high resistance state (the reset state) by a reset operation. The reset operation applies a voltage at a certain magnitude or more to both ends of the variable resistive element VR. The reset operation is performed by, for example, applying a voltage in the direction reverse to the setting operation. Immediately after the manufacture, the variable resistive element VR is in a state of not easily changing its resistive state and in the high resistance state. Therefore, a forming operation, which applies a high voltage equal to or more than the setting operation and the reset operation to both ends of the variable resistive element VR, is performed. This forming operation forms a region where a current is likely to locally flow in the variable resistive element VR (a filament path). This allows the variable resistive element VR to easily change the resistive state, being operable as a storage element.

As illustrated in FIG. 2, the selection gate transistor STr is disposed between the bit line BL and the global bit line GBL. The global bit lines GBL are disposed at predetermined pitches in the X direction and extend in the Y direction. The one global bit line GBL is connected in common to the lower ends (one ends) of the plurality of selection gate transistors STr, which are disposed in a line in the Y direction.

The selection gate lines SG are disposed at predetermined pitches in the Y direction and extend in the X direction. The one selection gate line SG is connected in common to the gates of the plurality of selection gate transistors STr, which are disposed in a line in the X direction. The two selection gate transistors STr, which are adjacently disposed in the Y direction, are connected to the different selection gate lines SG and independently operate.

Figure 3:
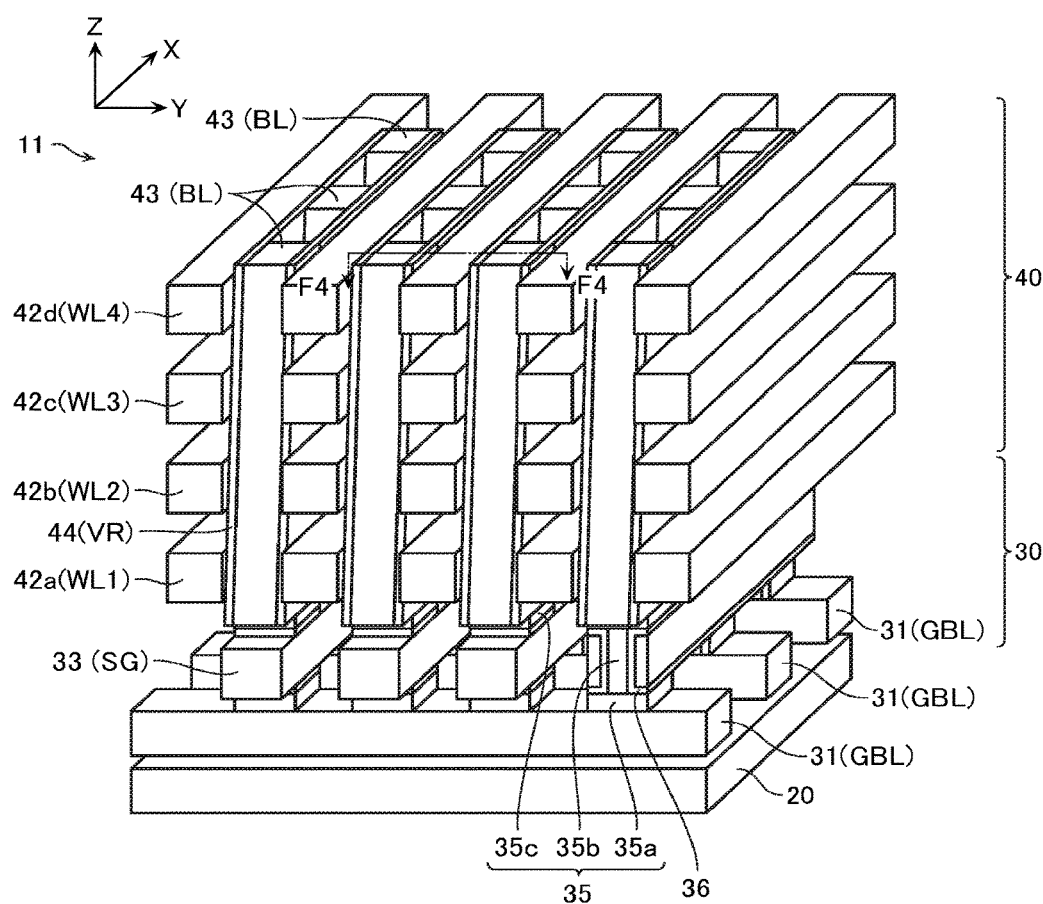
FIG. 3 is a perspective view illustrating a part of the structure of the semiconductor memory device.
Figure 4:
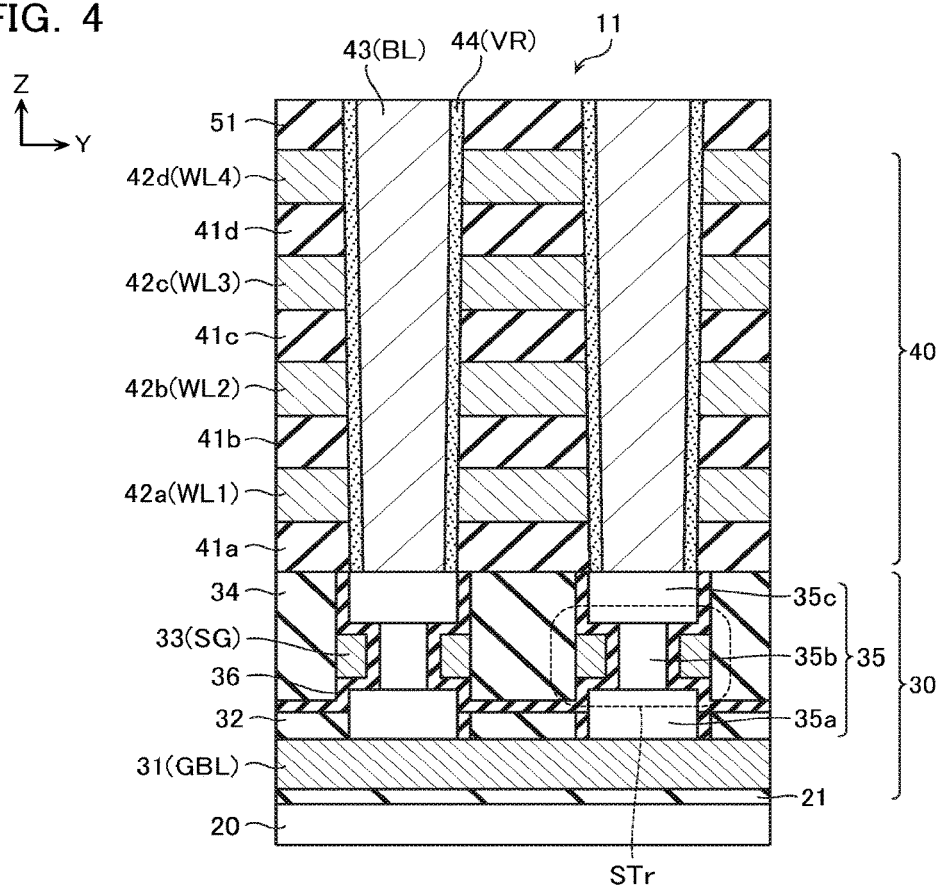
FIG. 4 is a cross-sectional view viewed from an X direction in FIG. 3.

The following describes the laminated structure of the memory cell array 11 according to the first embodiment with reference to FIG. 3 and FIG. 4. FIG. 3 is a perspective view illustrating the laminated structure of the memory cell array 11. FIG. 4 is a cross-sectional view viewed from the X direction in FIG. 3. FIG. 3 omits the illustration of a part of the structure such as an interlayer insulating layer.

The memory cell array 11, as illustrated in FIG. 3, includes a selection transistor layer 30 and a memory layer 40 laminated above a substrate 20. As illustrated in FIG. 4, an interlayer insulating layer 21 is formed on the substrate 20. The selection transistor layer 30 functions as the selection gate transistor STr. The memory layer 40 functions as the memory cell MC.

As illustrated in FIG. 3 and FIG. 4, the selection transistor layer 30 includes conducting layers 31 having a strip shape and interlayer insulating layers (not illustrated). The conducting layers 31 are disposed at predetermined pitches in the X direction and extend in the Y direction. The interlayer insulating layers are disposed between the plurality of conducting layers 31. The conducting layer 31 functions as the global bit line GBL. The conducting layer 31 is made of, for example, tungsten (W) and polysilicon.

As illustrated in FIG. 3 and FIG. 4, the selection transistor layer 30 includes a plurality of semiconductor layers 35. The semiconductor layers 35 are disposed in the X direction and the Y direction along the conducting layers 31 and extend in the Z direction. The selection transistor layer 30 includes insulating layers 36 and conducting layers 33. The insulating layers 36 cover a part of sidewalls of the semiconductor layer 35. The conducting layer 33 is opposed to the sidewall of the semiconductor layer 35 via the insulating layer 36 and extends in the X direction. As illustrated in FIG. 4, the semiconductor layer 35 includes a lower-layer semiconductor layer 35a, an intermediate-layer semiconductor layer 35b, and an upper-layer semiconductor layer 35c laminated from downward to upward. Further, between the lower-layer semiconductor layers 35a adjacent in the Y direction, an insulating layer 32 is disposed. Between the conducting layers 33, an insulating layer 34 is disposed.

The lower-layer semiconductor layer 35a and the upper-layer semiconductor layer 35c function as the source and the drain (the diffusion layers) of the selection gate transistor STr. The intermediate-layer semiconductor layer 35b functions as a channel (a body) of the selection gate transistor STr. The insulating layer 36 functions as the gate insulating layer of the selection gate transistor STr. The conducting layer 33 functions as the gate electrode and the selection gate line SG of the selection gate transistor STr.

The conducting layer 33 is made of, for example, polysilicon. The insulating layer 32, the insulating layer 34, and the insulating layer 36 are made of, for example, silicon oxide ($SiO_2$). The lower-layer semiconductor layer 35a and the upper-layer semiconductor layer 35c are made of polysilicon into which N+ type impurities are injected. The intermediate-layer semiconductor layer 35b is made of polysilicon into which P+ type impurities are injected. Note that, for example, the lower-layer semiconductor layer 35a and the upper-layer semiconductor layer 35c may be made of polysilicon into which P+ type impurities are injected. The intermediate-layer semiconductor layer 35b may be made of polysilicon into which N+ type impurities are injected. Alternatively, for example, the lower-layer semiconductor layer 35a and the upper-layer semiconductor layer 35c may be made of polysilicon into which N+ type impurities are injected. The intermediate-layer semiconductor layer 35b may be made of oxide semiconductor.

As illustrated in FIG. 4, the memory layer 40 includes interlayer insulating layers 41a to 41d and conducting layers 42a to 42d, which are laminated in alternation in the Z direction and extend in the X direction, and protecting layers 51 laminated on the conducting layers 42d. The conducting layers 42a to 42d each function as the word lines WL1 to WL4. The interlayer insulating layers 41a to 41d are made of, for example, silicon oxide ($SiO_2$). The conducting layers 42a to 42d are made of, for example, polysilicon. As illustrated in FIG. 3 and FIG. 4, the center position of the conducting layers 42a to 42d in the Y direction differs from the center position of the conducting layers 33 in the Y direction. In the example illustrated in FIG. 3 and FIG. 4, the center position of the conducting layers 42a to 42d in the Y direction is located midway between the two conducting layers 33 adjacent in the Y direction.

As illustrated in FIG. 4, the memory layer 40 includes, for example, columnar conducting layers 43 and variable resistance layers 44. The conducting layer 43 functions as the bit line BL. The variable resistance layer 44 functions as the variable resistive element VR.

As illustrated in FIG. 3, the conducting layers 43 are disposed in a matrix in the X and Y directions. The lower end (the one end) of the conducting layer 43 is in contact with the top surface of the semiconductor layer 35 and extends in a columnar shape in the Z direction. As illustrated in FIG. 4, the variable resistance layer 44 is disposed between the side surface of the conducting layer 43 in the Y direction and the side surfaces of the interlayer insulating layers 41a to 41d in the Y direction. As illustrated in FIG. 4, the variable resistance layer 44 is disposed between the side surface of the conducting layer 43 in the Y direction and the side surfaces of the conducting layers 42a to 42d in the Y direction.

With the embodiment, the conducting layer 43 is made of, for example, tungsten (W) and polysilicon. The variable resistance layer 44 is made of, for example, metal oxide (such as, $HfO_x$, $Al_2O_x$, $TiO_x$, $NiO_x$, $WO_x$, and $Ta_2O_x$). However, for example, the variable resistance layer 44 can also be consisted of a laminated layer of a silicon oxide layer and an ion source metal or a similar layer.

Figure 6:
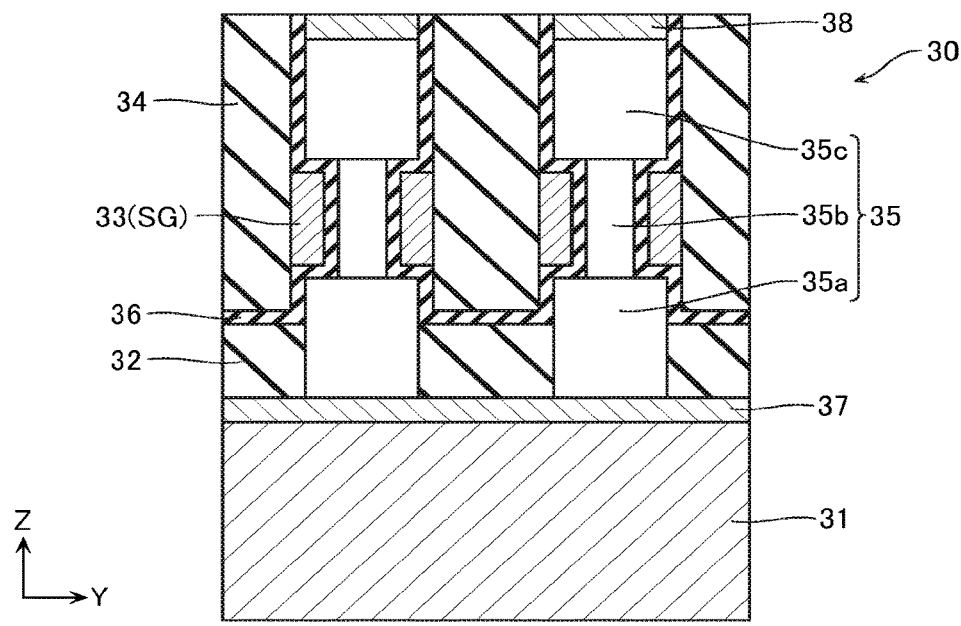
FIG. 6 is a cross-sectional view illustrating a part of the structure of the semiconductor memory device.

The film structure of the respective layers or a similar structure can be appropriately changed. Another layer can be inserted between the respective layers and a specific layer can be omitted or can be replaced by another layer. For example, as illustrated in FIG. 6, a conducting layer 37 may be inserted between the conducting layer 31 and the lower-layer semiconductor layers 35a. Similarly, as illustrated in FIG. 6, a conducting layer 38 may be inserted on the top surface of the upper-layer semiconductor layer 35c. The conducting layer 37 and the conducting layer 38 serve as a barrier layer in the manufacturing process. The conducting layer 37 and the conducting layer 38 can be made of, for example, titanium nitride (TiN).

Figure 5:
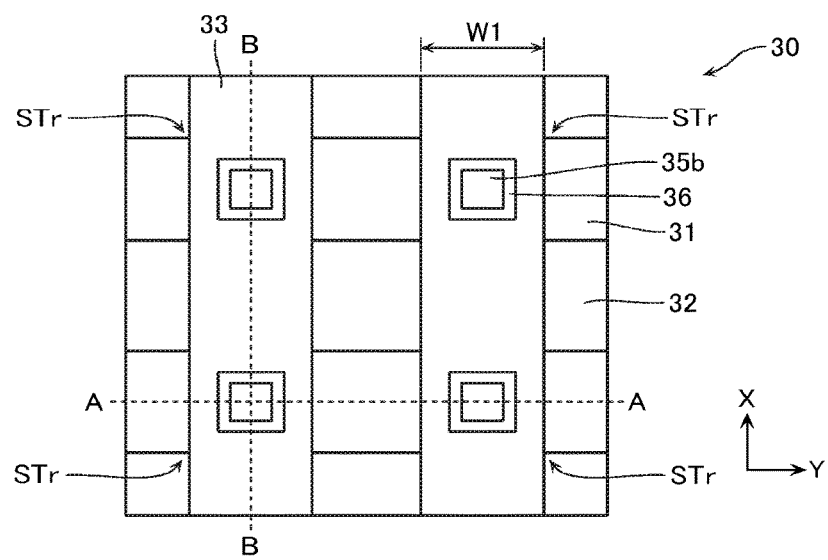
FIG. 5 is a cross-sectional view illustrating a part of the structure of the semiconductor memory device.
Figure 7:
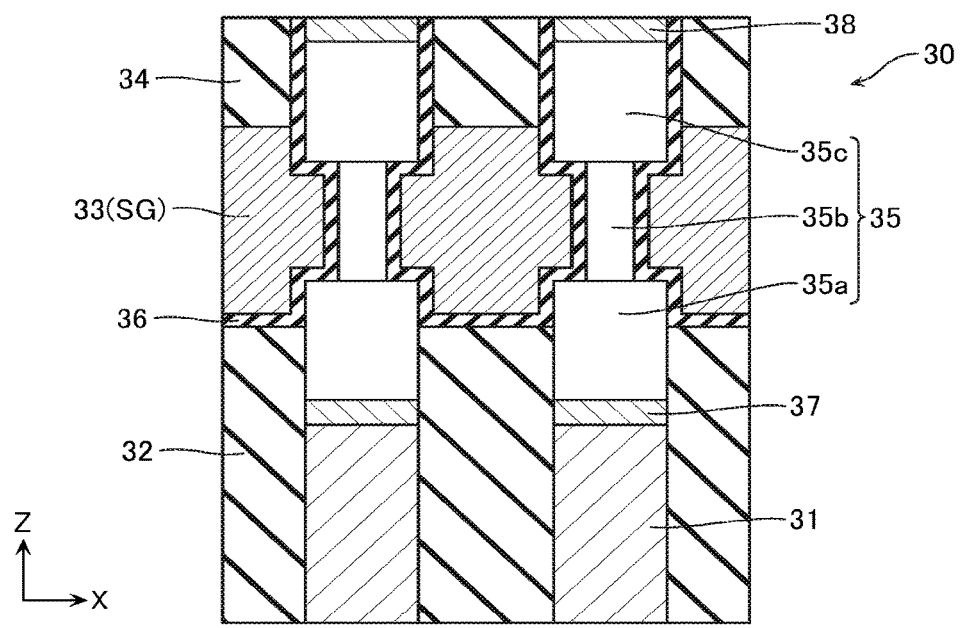
FIG. 7 is a cross-sectional view illustrating a part of the structure of the semiconductor memory device.
Figure 8:
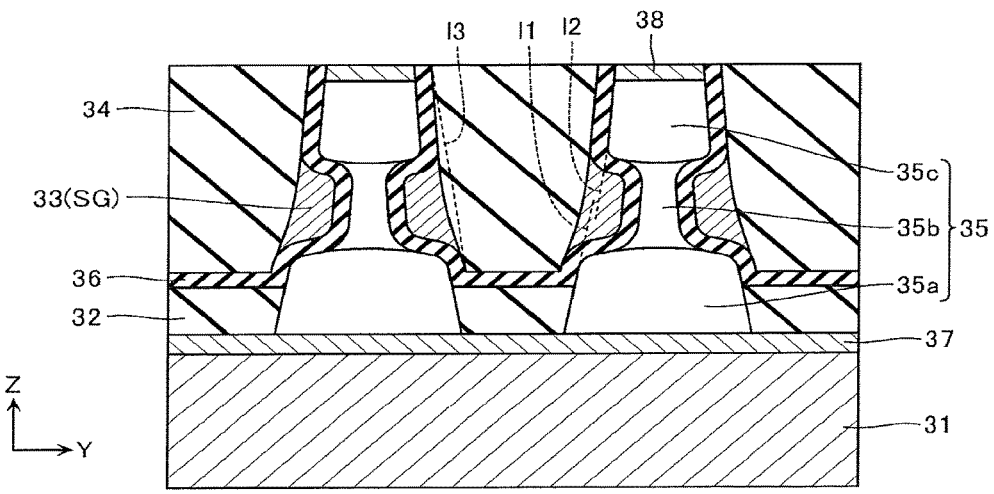
FIG. 8 is a cross-sectional view illustrating a part of the structure of the semiconductor memory device.

Next, the following describes the semiconductor memory device according to the embodiment in further details with reference to FIG. 5 to FIG. 8. FIG. 5 is a cross-sectional view of taking the selection transistor layer 30 along the X-Y surface passing through the semiconductor layers 35 and viewing the X-Y surface from the Z direction. FIG. 6 and FIG. 8 are cross-sectional views of taking the selection transistor layer 30 along the line A-A in FIG. 5 and viewing the selection transistor layer 30 from the X direction. FIG. 7 is a cross-sectional view of taking the selection transistor layer 30 along the line B-B in FIG. 5 and viewing the selection transistor layer 30 from the Y direction. FIG. 5 omits a part of the structure, such as the insulating layer.

As illustrated in FIG. 5, the selection transistor layer according to the embodiment includes a plurality of conducting layers 31 and a plurality of conducting layers 33. The conducting layers 31 extend in the Y direction and are disposed in the X direction via the insulating layers 32. The conducting layers 33 extend in the X direction and are disposed in the Y direction. The selection gate transistors STr are disposed at the respective parts where the conducting layers 31 intersect with the conducting layers 33. The conducting layers 33 cover the peripheral areas of the intermediate-layer semiconductor layers 35b via the insulating layers 36. The intermediate-layer semiconductor layer 35b operates as the channel of the selection gate transistor STr. In the example illustrated in FIG. 5, the width of the conducting layer 33 in the Y direction has a uniform size W1. In other words, the width of the conducting layer 33 in the Y direction is identical between the periphery of the selection gate transistor STr and the position between the two selection gate transistors STr adjacent in the X direction.

As illustrated in FIG. 6 and FIG. 7, the selection transistor layer 30 according to the embodiment includes the lower-layer semiconductor layers 35a, the intermediate-layer semiconductor layers 35b, and the upper-layer semiconductor layers 35c laminated from downward to upward. Here, the widths of the intermediate-layer semiconductor layer 35b in the X direction and the Y direction are smaller than the widths of the lower-layer semiconductor layer 35a and the upper-layer semiconductor layer 35c in the X direction and the Y direction. In other words, the side surfaces of the semiconductor layer 35 are hollowed along the intermediate-layer semiconductor layer 35b. In the example illustrated in FIG. 6 and FIG. 7, only the widths of the intermediate-layer semiconductor layer 35b in the X direction and the Y direction are formed small. However, for example, the widths of the upper portion of the lower-layer semiconductor layer 35a and the lower portion of the upper-layer semiconductor layer 35c may also be small. In this case, the conducting layer 33 also may cover peripheral areas of the upper portion of the lower-layer semiconductor layer 35a and the lower portion of the upper-layer semiconductor layer 35c via the insulating layers 36 in addition to the intermediate-layer semiconductor layer 35b.

As illustrated in FIG. 6, the conducting layers 33 are formed on the side surfaces of the intermediate-layer semiconductor layer 35b via the insulating layers 36. The conducting layers 33 are formed on the side surfaces of the semiconductor layer 35 and formed so as to be embedded into the depressed portions covered with the insulating layers 36. In other words, the top surfaces of the conducting layers 33 are opposed to the lower surface of the upper-layer semiconductor layer 35c via the insulating layers 36. The lower surfaces of the conducting layer 33 are opposed to the top surface of the lower-layer semiconductor layer 35a via the insulating layers 36. Viewed from the X direction, the side surface of the conducting layer 33 on the opposite side from the semiconductor layer 35 is formed to approximately match the side surface outside the insulating layer 36, which is formed along the lower-layer semiconductor layer 35a and the upper-layer semiconductor layer 35c.

As illustrated in FIG. 8, for the sake of convenience of manufacture, the following also possibly occurs. The sidewalls of the semiconductor layer 35 are inclined such that the width of the semiconductor layer 35 in the Y direction increases as approaching the conducting layer 31. The curvature radiuses of the edge portion of the top surface of the lower-layer semiconductor layer 35a and the edge portion of the lower surface of the upper-layer semiconductor layer 35c increase. In this case as well, for example, comparing the average value of the widths of the lower-layer semiconductor layer 35a and the upper-layer semiconductor layer 35c with the average value of the width of the intermediate-layer semiconductor layer 35b, the average value of the width of the intermediate-layer semiconductor layer 35b possibly decreases.

When the semiconductor layer 35 is formed like FIG. 8, at least a part of the conducting layer 33 may enter into the intermediate-layer semiconductor layer 35b side more than an imaginary line 11, which extends along the sidewall of the lower-layer semiconductor layer 35a. Alternatively, at least a part of the conducting layer 33 may enter into the intermediate-layer semiconductor layer 35b side more than an imaginary line 12, which extends along the sidewall of the upper-layer semiconductor layer 35c. Further, the entire conducting layer 33 may enter into the intermediate-layer semiconductor layer 35b side more than an imaginary line 13, which passes through the upper end of the insulating layer 36 and the sidewall of the part of the insulating layer 36 covering the lower-layer semiconductor layer 35a. In the conducting layer 33, the width of the part positioned outside the imaginary line 11 in the Y direction (the opposite side from the intermediate-layer semiconductor layer 35b with respect to the imaginary line 11) may be equal to or less than the film thickness of the insulating layer 36.

Figure 9:
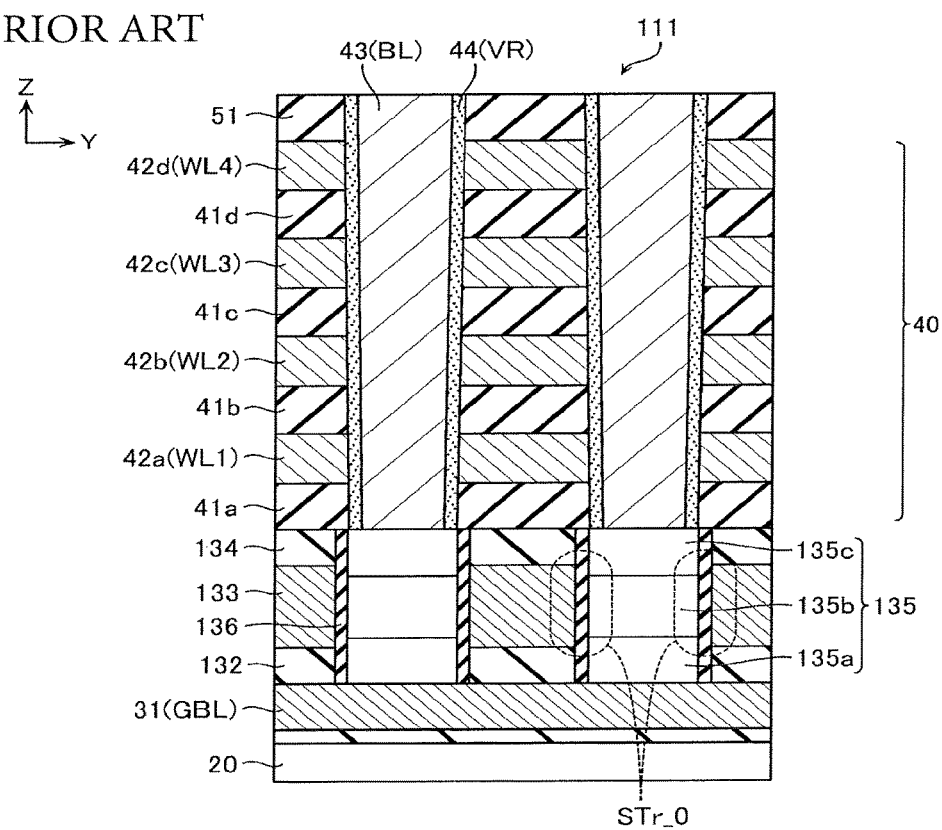
FIG. 9 is a cross-sectional view illustrating a part of the structure of a semiconductor memory device according to a comparative example.

Next, the following describes a semiconductor memory device according to a comparative example with reference to FIG. 9 for comparison. FIG. 9 is a cross-sectional view illustrating a laminated structure of a memory cell array 111 according to the comparative example.

As illustrated in FIG. 9, in the memory cell array 111 according to the comparative example, the widths of a lower-layer semiconductor layer 135a, an intermediate-layer semiconductor layer 135b, and an upper-layer semiconductor layer 135c in the Y direction approximately match. In other words, the side surface of the intermediate-layer semiconductor layer 135b is not depressed. The lower-layer semiconductor layer 135a and the upper-layer semiconductor layer 135c function as the source and the drain (the diffusion layers) of a selection gate transistor STr_0. The intermediate-layer semiconductor layer 135b functions as the channel of the selection gate transistor STr_0.

As illustrated in FIG. 9, the memory cell array 111 according to the comparative example includes conducting layers 133. The conducting layer 133 is disposed between two semiconductor layers 135 adjacent in the Y direction. The conducting layer 133 extends in the X direction via an insulating layer 136. Here, the insulating layer 136 functions as the gate insulating layer of the selection gate transistor STr_0. The conducting layer 133 functions as the gate electrode common to the two selection gate transistors STr_0 adjacent in the Y direction. That is, in the comparative example illustrated in FIG. 9, the gate electrode of the two selection gate transistors STr_0 adjacent in the Y direction is electrically common.

Further, as illustrated in FIG. 9, in the memory cell array 111 according to the comparative example, the entire top surfaces of the conducting layers 133 are opposed to the conducting layers 42a. In the memory cell array 111 according to the comparative example, the entire lower surface of the conducting layer 133 is opposed to the conducting layer 31.

Here, the semiconductor memory device according to the comparative example, which is illustrated in FIG. 9, the gate electrode of the two selection gate transistors STr_0 adjacent in the Y direction is electrically common. Therefore, connection of the specific bit line BL and global bit line GBL results in a half-selected state of the selection gate transistor STr_0 adjacent to the selection gate transistor STr_0 desired to be selected. This probably increases an off current (a leak current) in this selection gate transistor STr_0.

In contrast to this, as illustrated in FIG. 2, with the embodiment, the gate electrode is electrically independent between the selection gate transistors STr adjacent in the Y direction. This prevents the off current (the leak current) from increasing, ensuring providing the semiconductor memory device where power consumption can be reduced.

Here, to cause the gate electrode between the selection gate transistors STr adjacent in the Y direction to be electrically independent, for example, the conducting layers 133 illustrated in FIG. 9 are possibly separated in the Y direction. However, in this case, a withstand voltage between the two conducting layers adjacent in the Y direction possibly becomes low. On the other hand, if separating these conducting layers in the Y direction to ensure the withstand voltage, miniaturization of the selection gate transistor STr may be difficult.

Therefore, with the embodiment, the width of the intermediate-layer semiconductor layer 35$b$ in the Y direction is reduced and the conducting layer 33 is formed so as to be opposed to this side surface. This allows causing the gate electrode to be electrically independent between the selection gate transistors STr adjacent in the Y direction without an increase in circuit area while ensuring the withstand voltage of the conducting layers 33 adjacent in the Y direction.

With the embodiment, the widths of the lower-layer semiconductor layer 35$a$ and the upper-layer semiconductor layer 35$c$ in the Y direction are formed larger than the width of the intermediate-layer semiconductor layer 35$b$ in the Y direction. This increases the areas on the X-Y planes of the lower-layer semiconductor layer 35$a$ and the upper-layer semiconductor layer 35$c$ to reduce the resistance of the selection gate transistors STr.

With the embodiment, the conducting layers 33 cover the peripheral area of the intermediate-layer semiconductor layer 35$b$, which operates as the channel of the selection gate transistor STr. This allows increasing a capacitance between the conducting layer 33 and the intermediate-layer semiconductor layer 35$b$, ensuring improving the dominion of the gate. This allows manufacturing the selection gate transistors STr exhibiting good switching property.

With the semiconductor memory device according to the comparative example, which is illustrated in FIG. 9, the entire top surface of the conducting layer 133 is opposed to the lower surface of the conducting layer 42$a$. Similarly, the entire lower surface of the conducting layer 133 is opposed to the top surface of the conducting layer 31. In contrast to this, with the semiconductor memory device according to the embodiment, as illustrated in FIG. 4, the conducting layers 33 are formed on the side surfaces of the semiconductor layer 35. The conducting layers 33 are formed so as to be embedded into the depressed portions covered with the insulating layers 36. In other words, the lower surfaces of the conducting layers 33 are opposed to the top surface of the lower-layer semiconductor layer 35$a$ and the top surfaces are opposed to the lower surface of the upper-layer semiconductor layer 35$c$. This reduces the areas on the X-Y planes of the conducting layer 33 opposed to the conducting layer 42$a$ and the conducting layer 31 while ensuring the area on the Y-Z plane of the conducting layer 33. This allows providing the semiconductor memory device that reduces a parasitic capacitance generated between these planes and operates at high speed. This allows separating the distance between the conducting layers 33 adjacent in the Y direction while ensuring the area on the Y-Z plane of the conducting layer 33. Additionally, this enhances the withstand voltage between the conducting layer 42$a$ and the conducting layer 33, ensuring minimizing the leak current.

[Manufacturing Method]

Next, the following describes a method for manufacturing the semiconductor memory device according to the embodiment with reference to FIG. 10 to FIG. 23. FIG. 10 to FIG. 23 are cross-sectional views illustrating the method for manufacturing the semiconductor memory device according to the embodiment.

Figure 10:
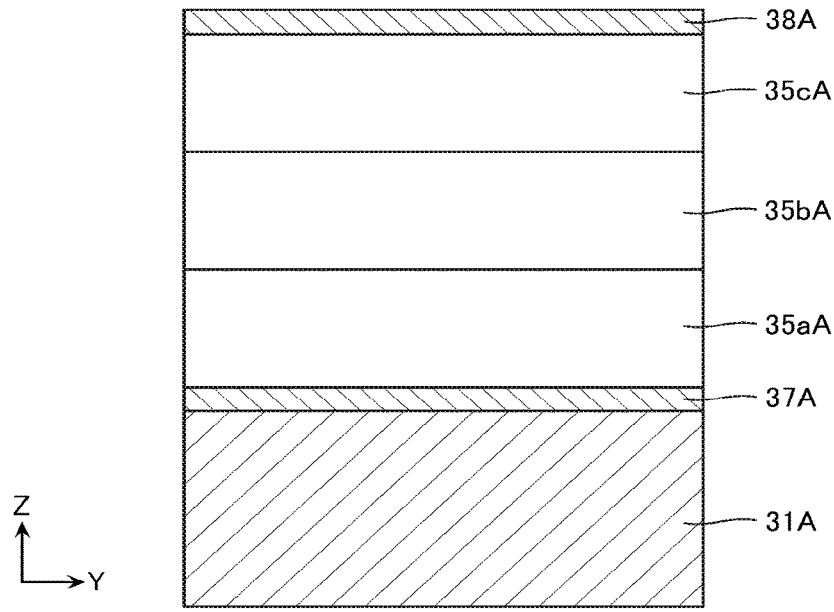
FIG. 10 is a cross-sectional view illustrating a method for manufacturing the semiconductor memory device.
Figure 11:
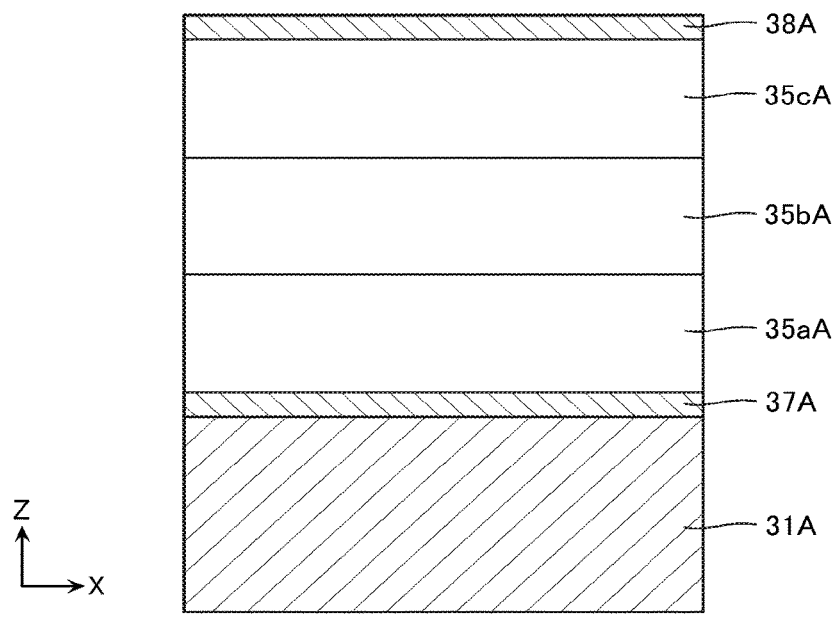
FIG. 11 is a cross-sectional view illustrating a method for manufacturing the semiconductor memory device.

As illustrated in FIG. 10 and FIG. 11, with the manufacturing method according to the embodiment, a conducting layer 31A, a conducting layer 37A, a semiconductor layer 35$a$A, a semiconductor layer 35$b$A, a semiconductor layer 35$c$A, and a conducting layer 38A are laminated on a substrate (not illustrated).

Figure 12:
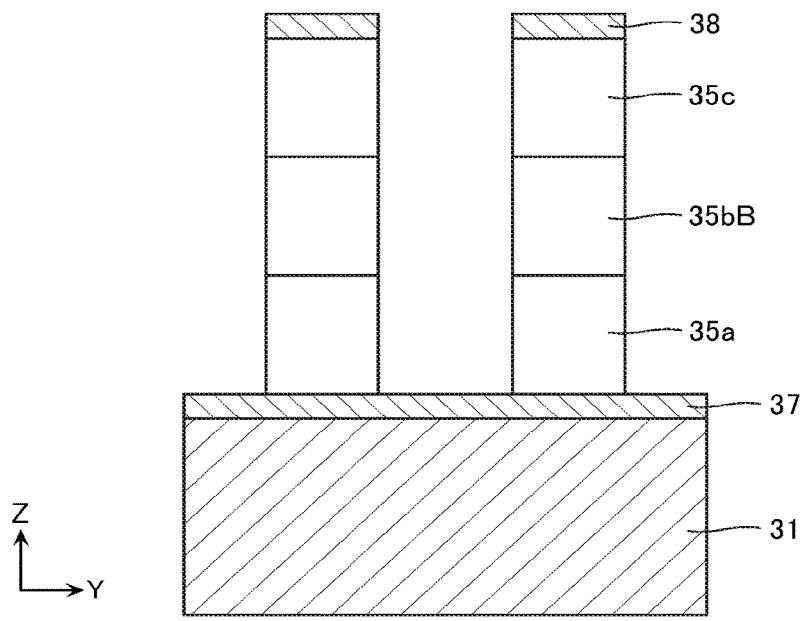
FIG. 12 is a cross-sectional view illustrating a method for manufacturing the semiconductor memory device.
Figure 13:
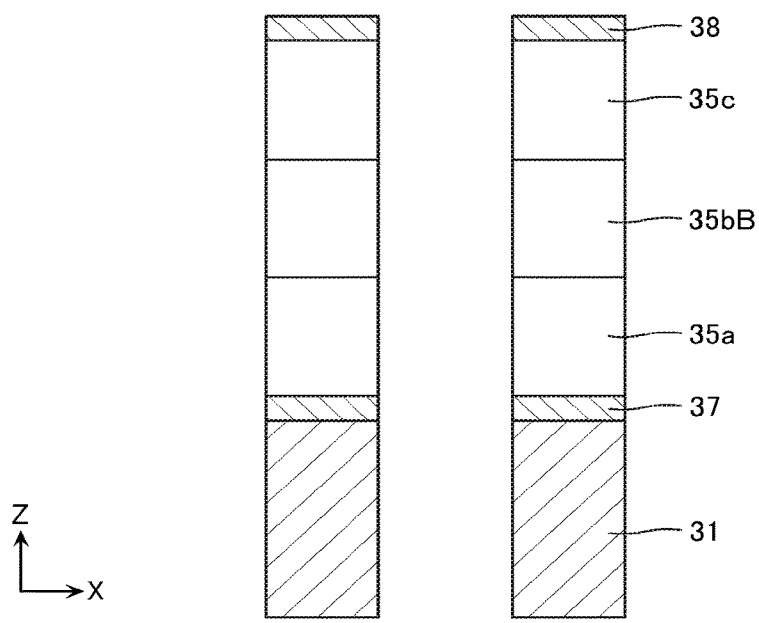
FIG. 13 is a cross-sectional view illustrating a method for manufacturing the semiconductor memory device.

Next, as illustrated in FIG. 12 and FIG. 13, the conducting layer 31A and the conducting layer 37A are separated in the X direction to form a conducting layer 31 and the conducting layer 37. The semiconductor layer 35$a$A, the semiconductor layer 35$b$A, the semiconductor layer 35$c$A, and the conducting layer 38A are formed into a columnar shape, thus forming the lower-layer semiconductor layer 35$a$, a semiconductor layer 35$b$B, the upper-layer semiconductor layer 35$c$, and the conducting layer 38. This process, for example, patterns a resist (not illustrated) or a similar member by Photo Engraving Process (PEP). Using this resist or a similar member as a mask, Reactive Ion Etching (RIE) is performed.

Figure 14:
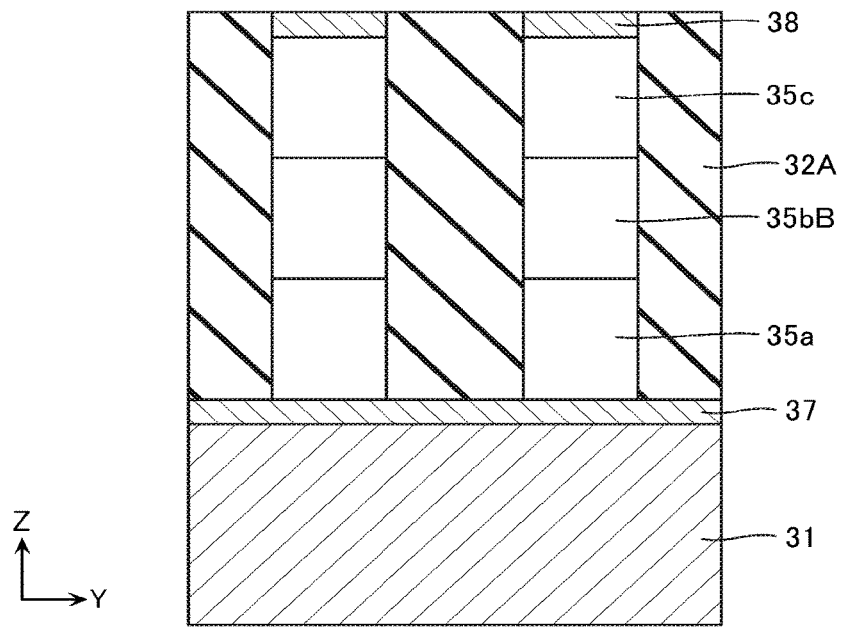
FIG. 14 is a cross-sectional view illustrating a method for manufacturing the semiconductor memory device.
Figure 15:
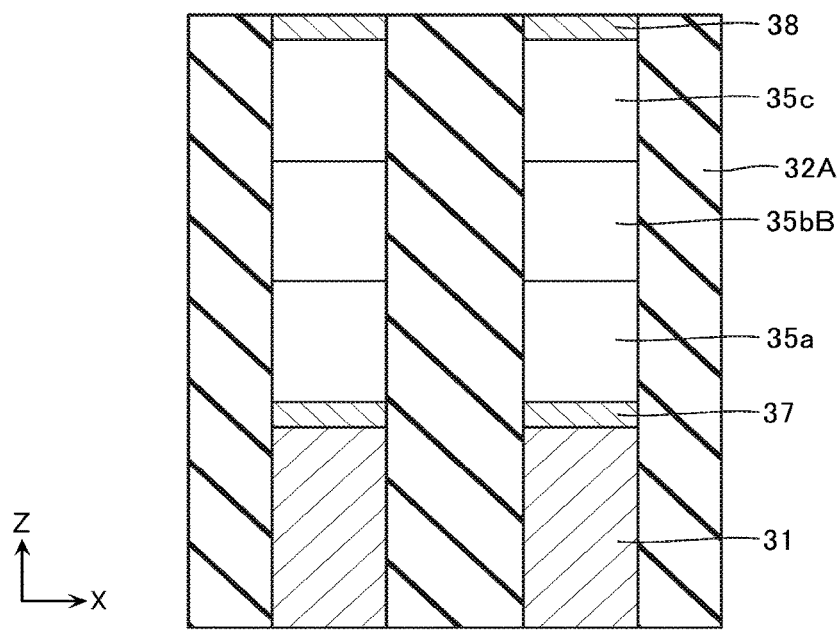
FIG. 15 is a cross-sectional view illustrating a method for manufacturing the semiconductor memory device.

Next, as illustrated in FIG. 14 and FIG. 15, at regions between the conducting layers 31 and the conducting layers 37; and the lower-layer semiconductor layers 35$a$, the semiconductor layers 35$b$B, the upper-layer semiconductor layers 35$c$, and the conducting layers 38, insulating layers 32A, which will be the insulating layers 32, are embedded. The insulating layer 32A may be flattened by means such as a Chemical Mechanical Polishing (CMP). In this case, for example, the conducting layer 38 can serve as a stopper.

Figure 16:
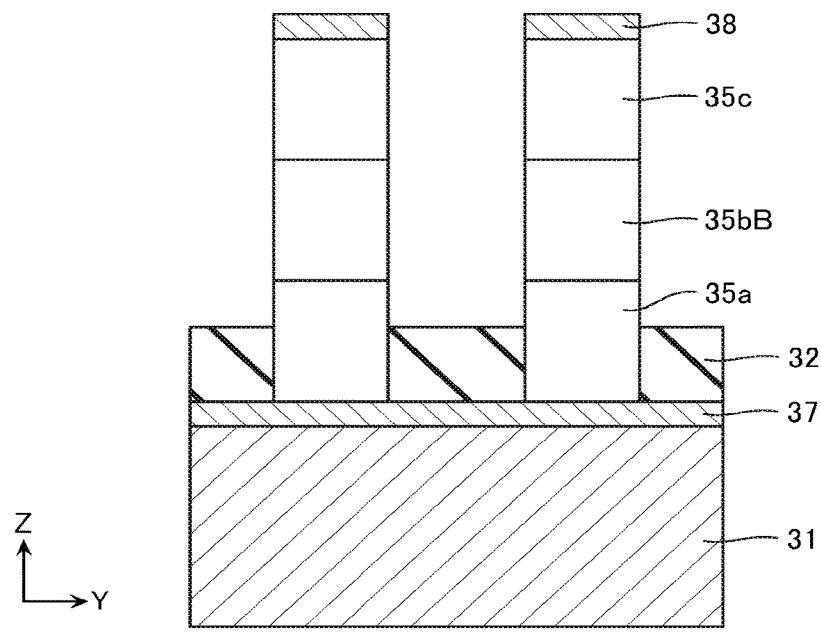
FIG. 16 is a cross-sectional view illustrating a method for manufacturing the semiconductor memory device.
Figure 17:
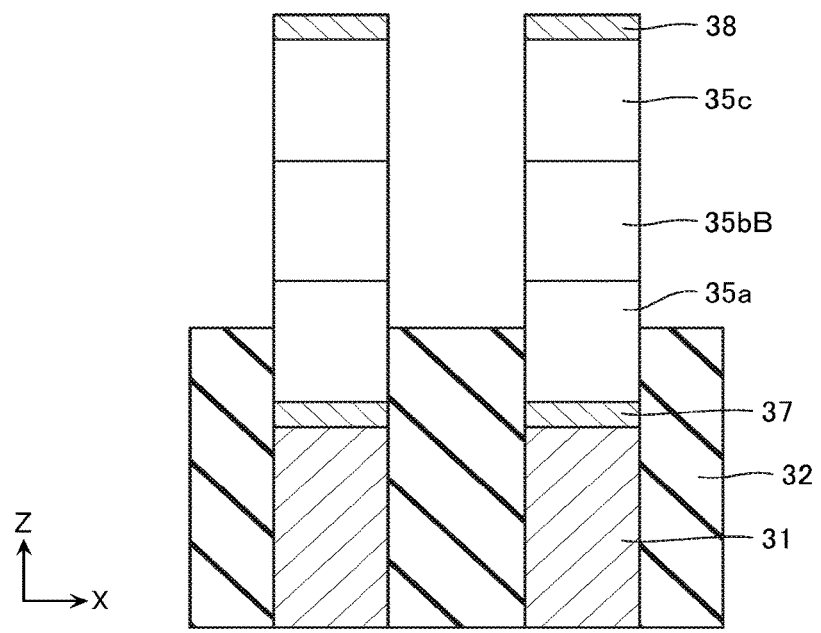
FIG. 17 is a cross-sectional view illustrating a method for manufacturing the semiconductor memory device.

Next, as illustrated in FIG. 16 and FIG. 17, the insulating layers 32A are partially removed to lower the top surfaces, thus forming the insulating layers 32. In this respect, the height of the top surface of the insulating layer 32 is adjusted so as to be lower than the height of the lower surface of the semiconductor layer 35$b$B. This process is performed by means such as the RIE.

Figure 18:
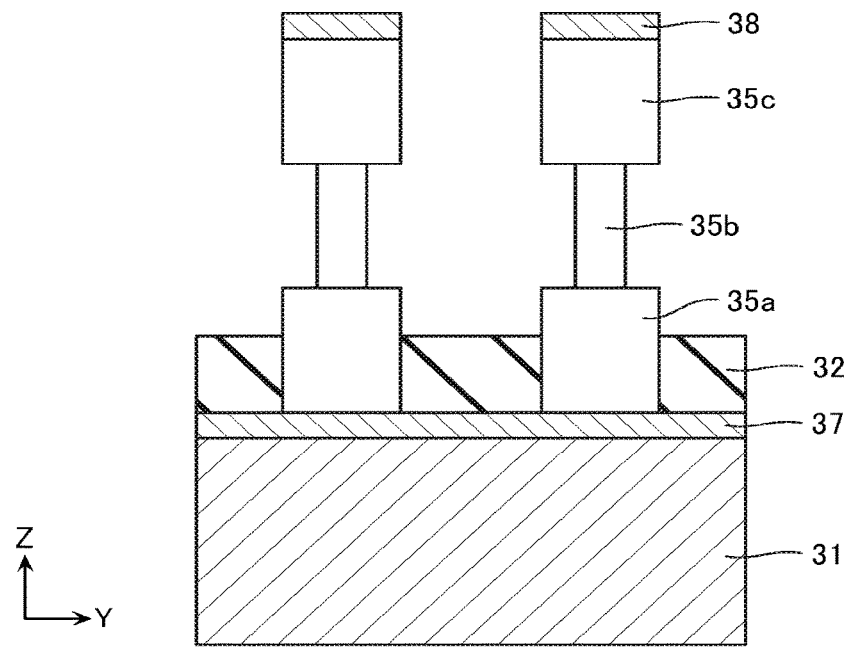
FIG. 18 is a cross-sectional view illustrating a method for manufacturing the semiconductor memory device.
Figure 19:
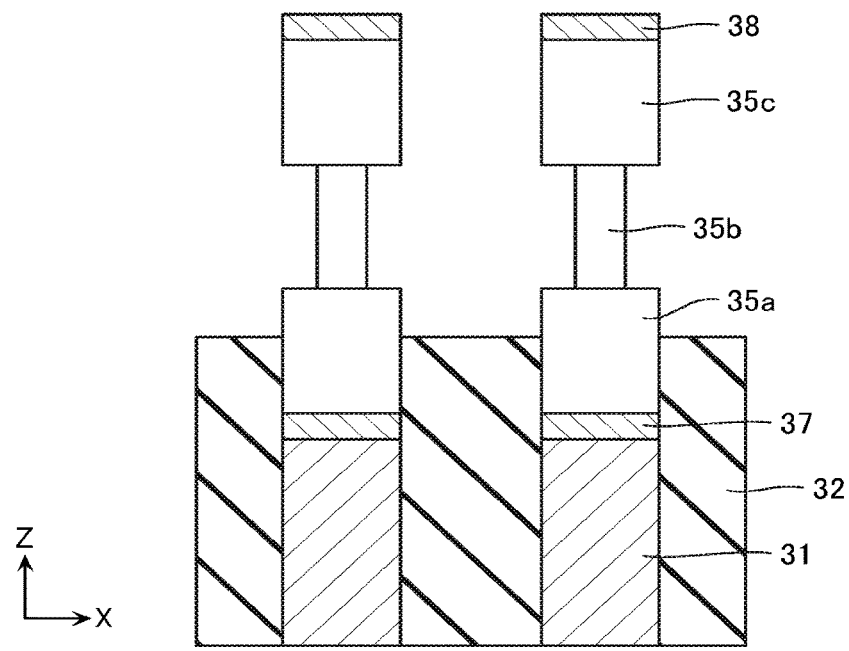
FIG. 19 is a cross-sectional view illustrating a method for manufacturing the semiconductor memory device.

Next, as illustrated in FIG. 18 and FIG. 19, the widths of the semiconductor layer 35$b$B in the X direction and the Y direction are designed to be smaller than the widths of the lower-layer semiconductor layer 35$a$ and the upper-layer semiconductor layer 35$c$. This process forms the intermediate-layer semiconductor layer 35$b$. This process will be described later.

Figure 20:
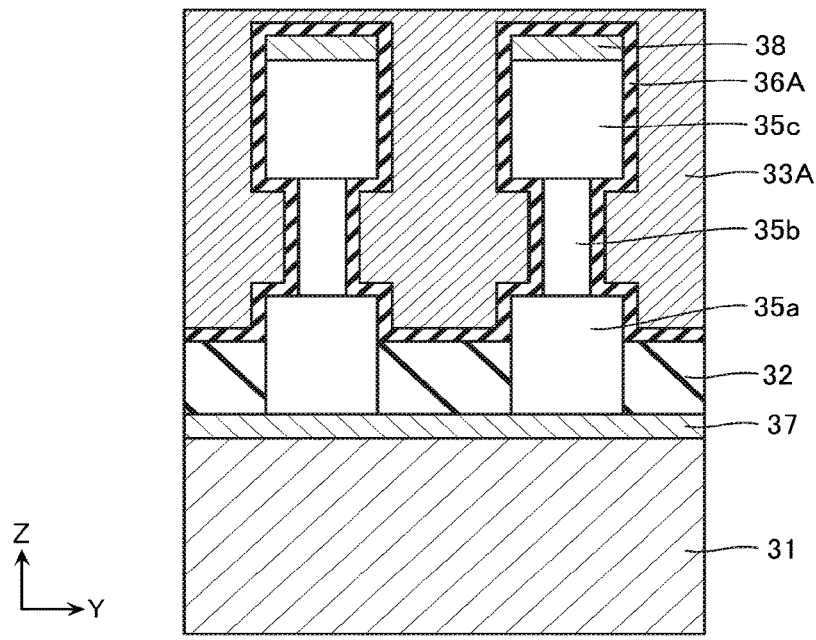
FIG. 20 is a cross-sectional view illustrating a method for manufacturing the semiconductor memory device.
Figure 21:
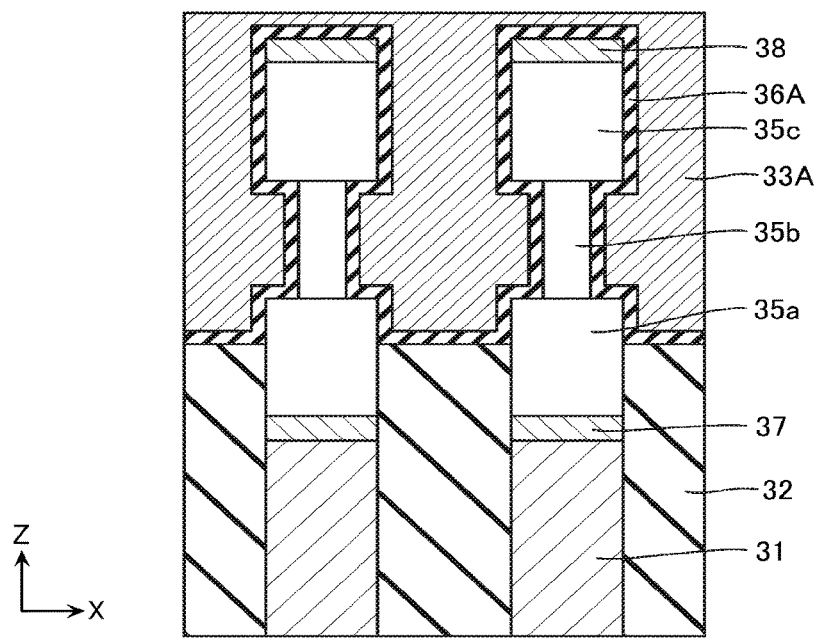
FIG. 21 is a cross-sectional view illustrating a method for manufacturing the semiconductor memory device.

Next, as illustrated in FIG. 20 and FIG. 21, an insulating layer 36A, which will be the insulating layer 36, is formed over the top surfaces of the insulating layers 32, the side surfaces of the lower-layer semiconductor layers 35$a$, the intermediate-layer semiconductor layers 35$b$, the upper-layer semiconductor layers 35$c$, and the conducting layers 38, and the top surfaces of the conducting layers 38. In the insulating layer 36A, the height of a part positioned over the top surface of the insulating layer 32 is adjusted so as to be lower than the height of the lower surface of the intermediate-layer semiconductor layer 35b. As illustrated in FIG. 20 and FIG. 21, a conducting layer 33A, which will be the conducting layer 33, is embedded. In this respect, the top surface of the conducting layer 33A may be flattened by means such as CMP.

Figure 22:
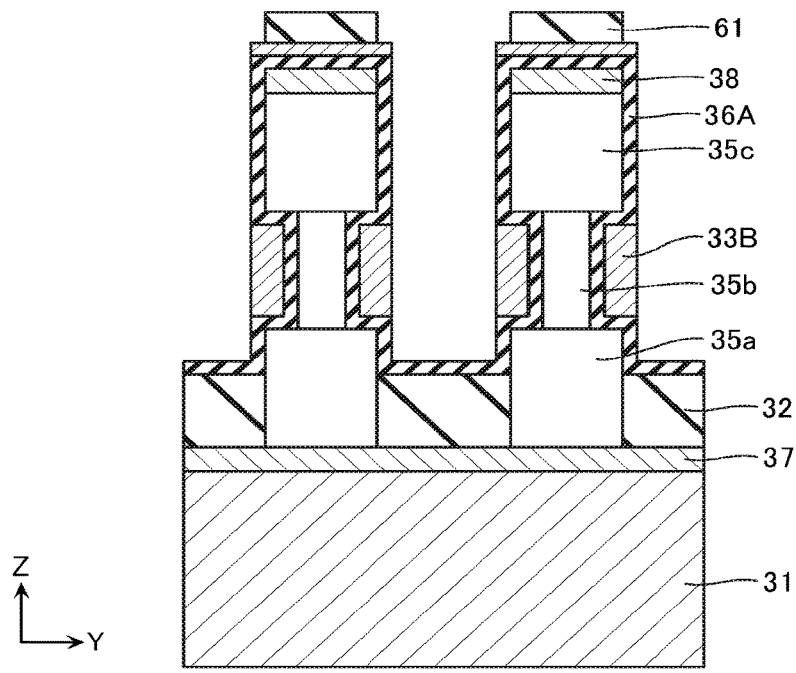
FIG. 22 is a cross-sectional view illustrating a method for manufacturing the semiconductor memory device.
Figure 23:
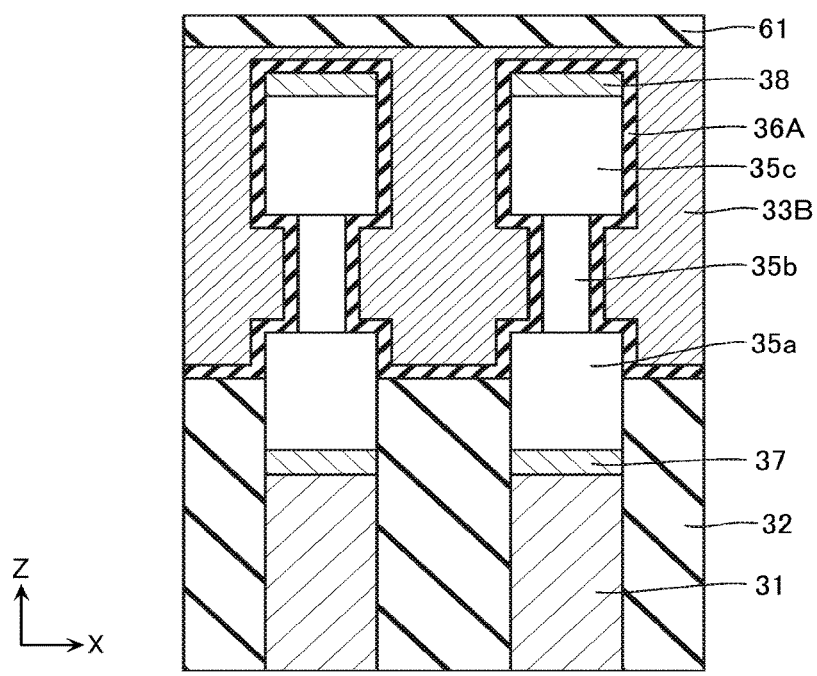
FIG. 23 is a cross-sectional view illustrating a method for manufacturing the semiconductor memory device.

Next, as illustrated in FIG. 22 and FIG. 23, mask materials 61 are formed on the conducting layers 33A. The plurality of mask materials 61 extend in the X direction and are disposed in the Y direction. Further, using the mask material 61 as the mask, the conducting layer 33A is partially removed to form conducting layers 33B. This process, for example, forms the mask materials 61 by the PEP and forms the conducting layers 33B by the RIE.

Next, as illustrated in FIG. 6 and FIG. 7, the mask materials 61 are removed. The heights of the top surfaces of the conducting layers 33B are adjusted to form the conducting layers 33. The insulating layers 34 are embedded, and further, in the insulating layer 36A, the parts positioned on the top surfaces of the conducting layers 38 are removed. This allows manufacturing the selection transistor layer 30 according to the embodiment. Further, for example, the conducting layers and the insulating layers are laminated in alternation on the upper layer of this selection transistor layer 30. The laminated layers are separated in the Y direction to form trenches. The variable resistance layers 44 and the columnar-shaped conducting layers 43 are formed in these trenches. Thus, the semiconductor memory device according to the embodiment can be manufactured.

Next, the following describes the process of decreasing the widths in the X direction and the Y direction of the semiconductor layer 35bB, which is described with reference to FIG. 18 and FIG. 19, in further details. As described with reference to FIG. 3 and FIG. 4, the embodiment allows constituting the lower-layer semiconductor layer 35a, the intermediate-layer semiconductor layer 35b, and the upper-layer semiconductor layer 35c made of various materials. Here, the processes described with reference to FIG. 18 and FIG. 19 are possibly performed by a different method depending on the materials of the lower-layer semiconductor layer 35a, the intermediate-layer semiconductor layer 35b, and the upper-layer semiconductor layer 35c.

For example, the lower-layer semiconductor layer 35a and the upper-layer semiconductor layer 35c may be made of polysilicon into which N+ type impurities are injected and the intermediate-layer semiconductor layer 35b may be made of polysilicon into which P+ type impurities are injected.

Figure 24:
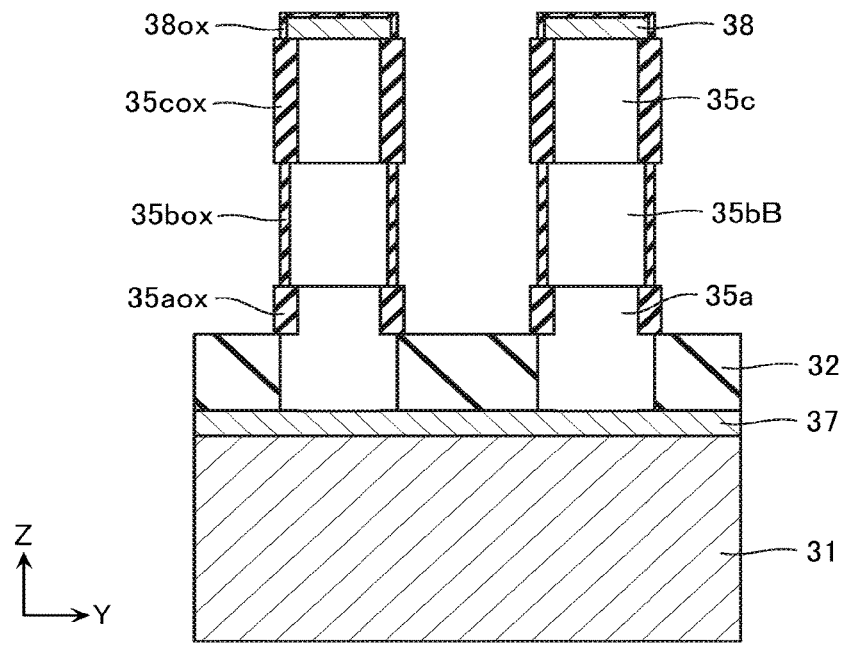
FIG. 24 is a cross-sectional view illustrating a method for manufacturing the semiconductor memory device.
Figure 25:
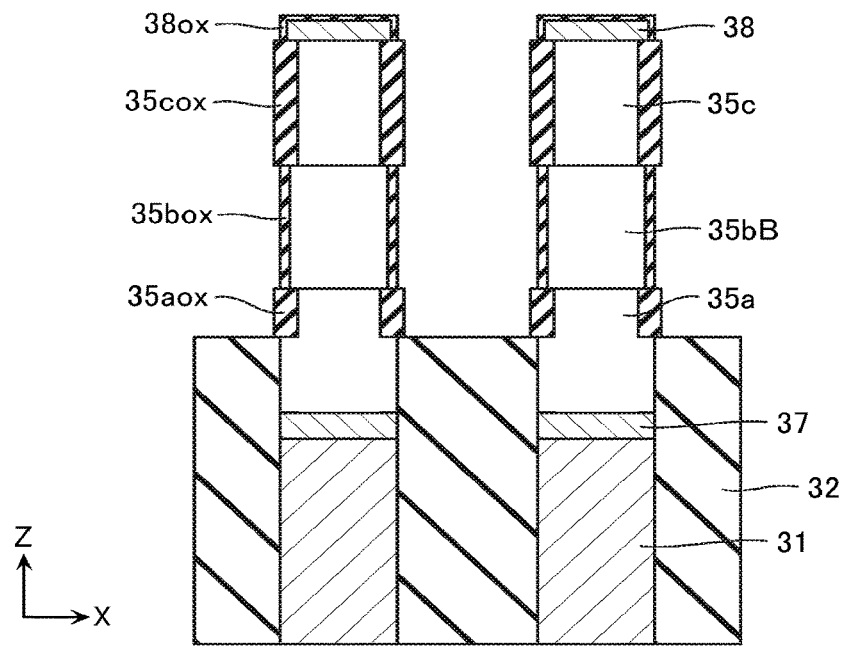
FIG. 25 is a cross-sectional view illustrating a method for manufacturing the semiconductor memory device.

In this case, for example, as illustrated in FIG. 16 and FIG. 17 A, after forming the insulating layers 32, as illustrated in FIG. 24 and FIG. 25, an oxidized treatment is performed. This forms oxide layers 35aox, 35box, 35cox, and 38ox on the exposed surfaces of the lower-layer semiconductor layers 35a, the semiconductor layers 35bB, the upper-layer semiconductor layers 35c, and the conducting layers 38. Here, the oxidation rate of N-type silicon is faster than the oxidation rate of P-type silicon. Therefore, the film thicknesses of the oxide layers 35aox and the oxide layers 35cox, which are formed on the sidewalls of the lower-layer semiconductor layer 35a and the upper-layer semiconductor layer 35c, are thicker than the film thickness of the oxide layers 35box, which are formed on the sidewalls of the semiconductor layer 35bB.

Figure 26:
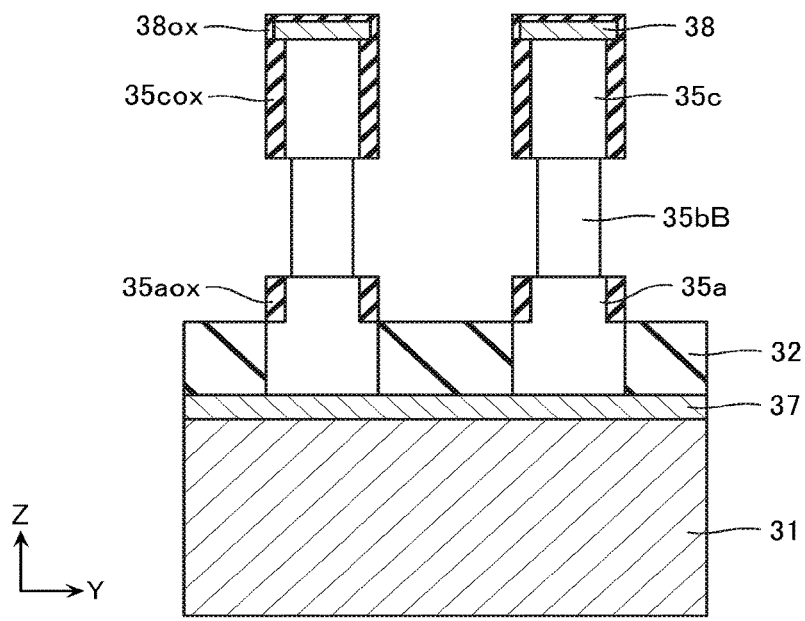
FIG. 26 is a cross-sectional view illustrating a method for manufacturing the semiconductor memory device.
Figure 27:
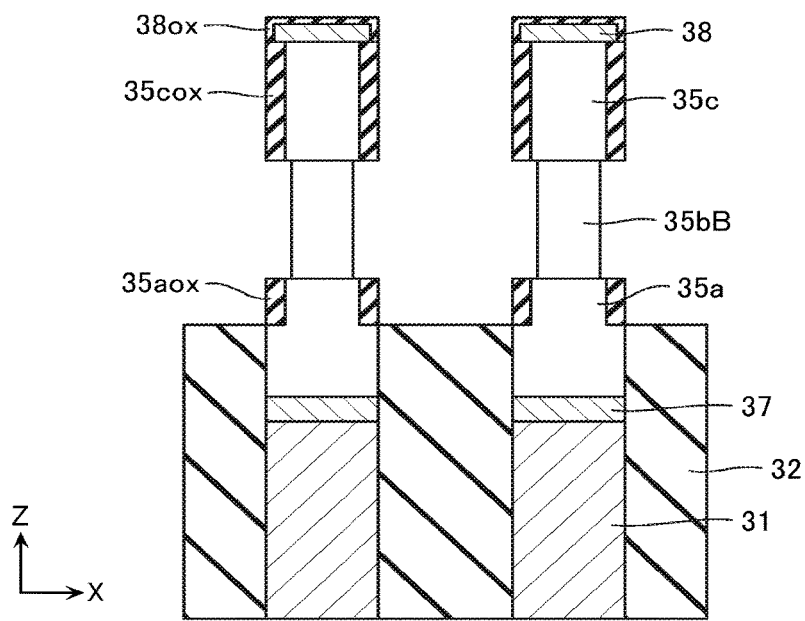
FIG. 27 is a cross-sectional view illustrating a method for manufacturing the semiconductor memory device.

Next, for example, as illustrated in FIG. 26 and FIG. 27, isotropic dry etching is performed. In this respect, the isotropic dry etching is performed under a condition where the etching rate of silicon is higher than the etching rate of silicon oxide. This removes the oxide layers 35box, which are formed comparatively thin, contracting the semiconductor layers 35bB. During this process, the oxide layers 35aox and 35cox protect the lower-layer semiconductor layers 35a and the upper-layer semiconductor layers 35c. In view of this, as illustrated in, FIG. 18 and FIG. 19, the widths of the semiconductor layer 35bB in the X direction and the Y direction can be formed smaller than the widths of the lower-layer semiconductor layer 35a and the upper-layer semiconductor layer 35c. If the oxide layers 35aox and 35cox might be removed before terminating the contraction of the intermediate-layer semiconductor layers 35b, the oxidized treatment may be performed again.

For example, the lower-layer semiconductor layer 35a and the upper-layer semiconductor layer 35c may be made of polysilicon into which the P+ type impurities are injected, and the intermediate-layer semiconductor layer 35b may be made of polysilicon into which the N+ type impurities are injected. In such case, for example, as illustrated in FIG. 16 and FIG. 17, after forming the insulating layer 32, alkaline wet etching is possibly performed. Here, in the alkaline wet etching, a part where the concentration of electrons is high exhibits higher etching rate. Accordingly, the etching rate of the semiconductor layer 35bB becomes higher than the etching rates of the lower-layer semiconductor layer 35a and the upper-layer semiconductor layer 35c. In view of this, as illustrated in FIG. 18 and FIG. 19, the widths of the semiconductor layer 35bB in the X direction and the Y direction can be smaller than the widths of the lower-layer semiconductor layer 35a and the upper-layer semiconductor layer 35c.

For example, the lower-layer semiconductor layer 35a and the upper-layer semiconductor layer 35c may be made of polysilicon into which the N+ type impurities are injected, and the intermediate-layer semiconductor layer 35b may be made of the oxide semiconductor. In such case, for example, as illustrated in FIG. 16 and FIG. 17, after forming the insulating layer 32, the etching is possibly performed. Here, the etching is possibly performed under a condition where the etching rate of the oxide semiconductor is higher than that of polysilicon. For example, the isotropic dry etching using hydrochloric acid gas is possibly performed. In view of this, as illustrated in FIG. 18 and FIG. 19, the widths of the semiconductor layer 35bB in the X direction and the Y direction can be smaller than the widths of the lower-layer semiconductor layer 35a and the upper-layer semiconductor layer 35c.

[Second Embodiment]

Figure 28:
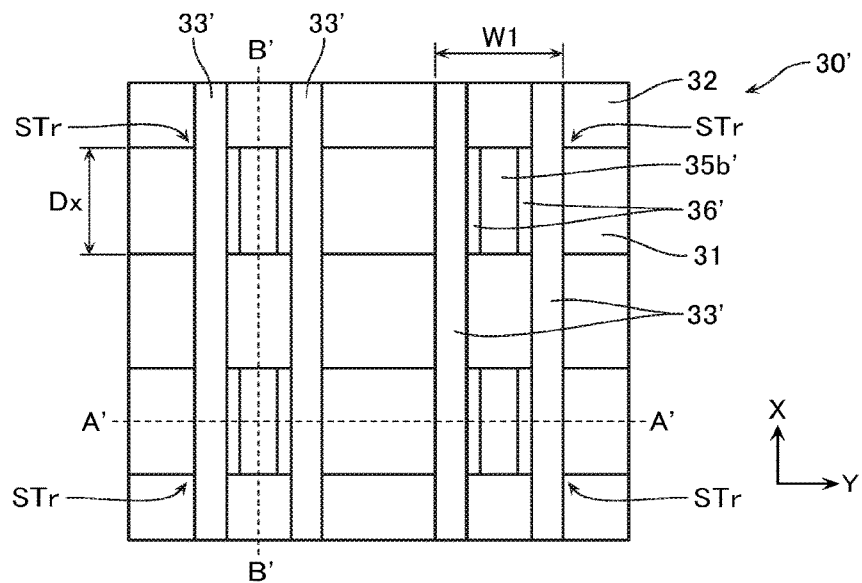
FIG. 28 is a cross-sectional view illustrating a part of the structure of a semiconductor memory device according to a second embodiment.
Figure 29:
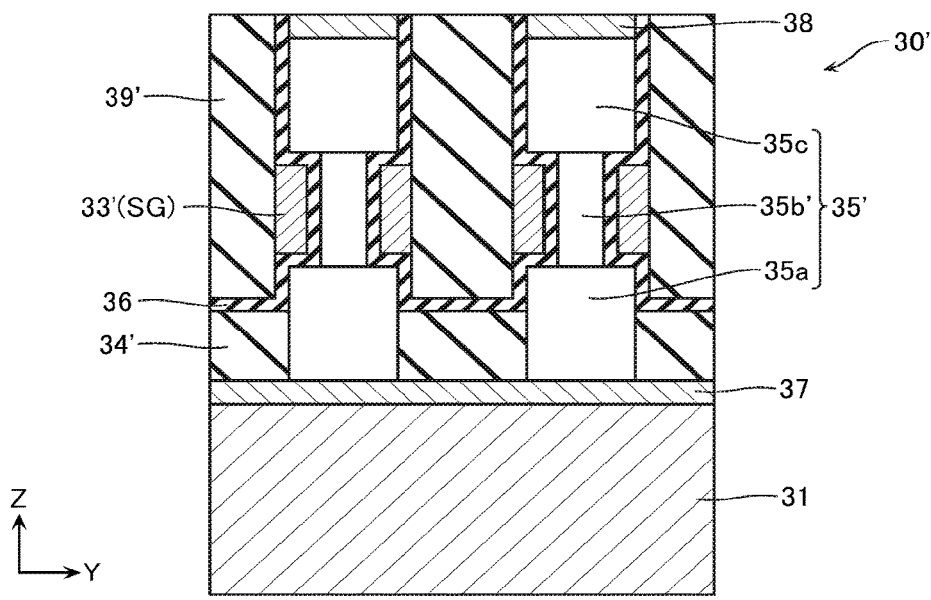
FIG. 29 is a cross-sectional view illustrating a part of the structure of the semiconductor memory device.
Figure 30:
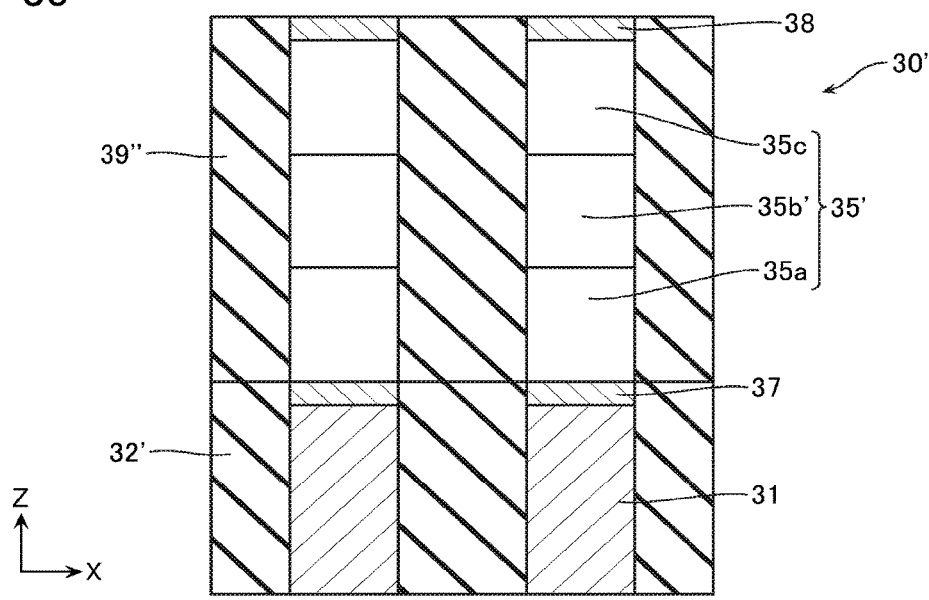
FIG. 30 is a cross-sectional view illustrating a part of the structure of the semiconductor memory device.

Next, the following describes a semiconductor memory device according to the second embodiment with reference to FIG. 28 to FIG. 30. FIG. 28 is a cross-sectional view of taking a selection transistor layer 30' of the semiconductor memory device according to the embodiment along the X-Y surface passing through a semiconductor layer 35' and viewed from the Z direction. FIG. 29 is a cross-sectional view of the selection transistor layer 30' taken along the line A'-A' in FIG. 28 and is viewed from the X direction. FIG. 30 is a cross-sectional view of the selection transistor layer 30' taken along the line B'-B' in FIG. 28 and viewed from the Y direction. FIG. 28 omits a part of the structure of the insulating layer or a similar member. Like reference numerals designate corresponding or identical elements to those of the first embodiment, and therefore such elements will not be further elaborated here.

The semiconductor memory device according to the second embodiment, similar to the first embodiment, has a structure as illustrated in FIG. 1 and FIG. 2. As illustrated in FIG. 28 to FIG. 30, the selection transistor layer 30' according to the embodiment is constituted basically similar to the selection transistor layer 30 according to the first embodiment. However, with the second embodiment, as illustrated in FIG. 28, a width Dx of an intermediate-layer semiconductor layer 35b' in the X direction approximately matches the widths of the lower-layer semiconductor layer 35a and the upper-layer semiconductor layer 35c in the X direction. The second embodiment differs from the first embodiment in this respect. The embodiment differs in that two conducting layers 33' are opposed to the intermediate-layer semiconductor layer 35b'. Such semiconductor memory device can be preferably manufactured as described later. These two conducting layers 33' function as the gate electrodes of the selection gate transistors STr and the selection gate lines SG. With the embodiment, the conducting layer 33' is preferably made of a metallic material such as tungsten (W).

Next, the following describes a method for manufacturing the semiconductor memory device according to the embodiment with reference to FIG. 31 to FIG. 55. FIG. 31 to FIG. 55 are cross-sectional views illustrating the method for manufacturing the semiconductor memory device according to the embodiment.

Figure 31:
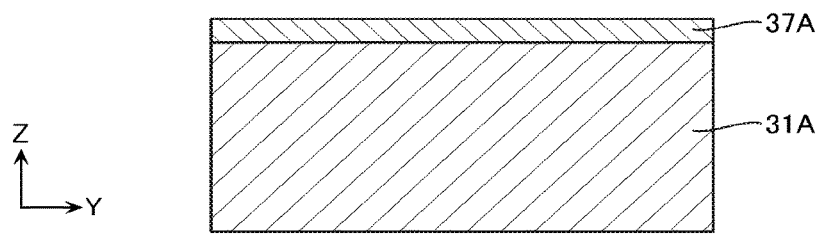
FIG. 31 is a cross-sectional view illustrating a method for manufacturing the semiconductor memory device.
Figure 32:
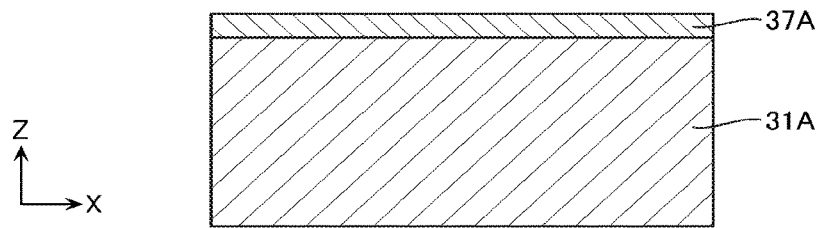
FIG. 32 is a cross-sectional view illustrating a method for manufacturing the semiconductor memory device.

As illustrated in FIG. 31 and FIG. 32, the manufacturing method according to the embodiment laminates the conducting layer 31A and the conducting layer 37A on a substrate (not illustrated).

Figure 33:
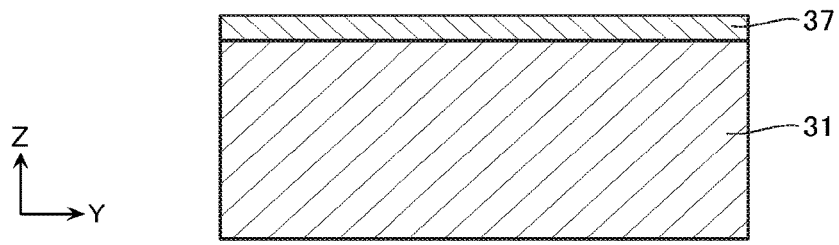
FIG. 33 is a cross-sectional view illustrating a method for manufacturing the semiconductor memory device.
Figure 34:
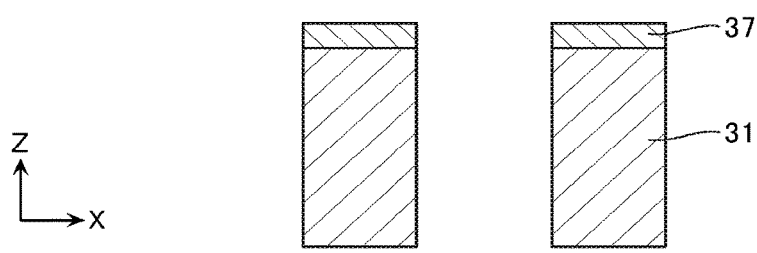
FIG. 34 is a cross-sectional view illustrating a method for manufacturing the semiconductor memory device.

Next, as illustrated in FIG. 33 and FIG. 34, the conducting layer 31A and the conducting layer 37A are separated in the X direction to form the conducting layer 31 and the conducting layer 37. This process, for example, patterns a resist (not illustrated) or a similar member by the PEP. Using this resist or a similar member as a mask, the RIE is performed.

Figure 35:
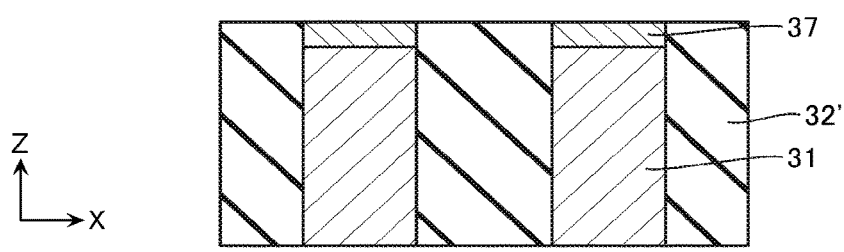
FIG. 35 is a cross-sectional view illustrating a method for manufacturing the semiconductor memory device.

Next, as illustrated in FIG. 35, insulating layers 32' are embedded into regions between the conducting layers 31 and the conducting layers 37. For example, the insulating layer may be embedded into the region between the conducting layer 31 and the conducting layer 37. Using the conducting layer 37 as a stopper, the CMP or a similar method is performed. Thus, the insulating layer 32' may be formed.

Figure 36:
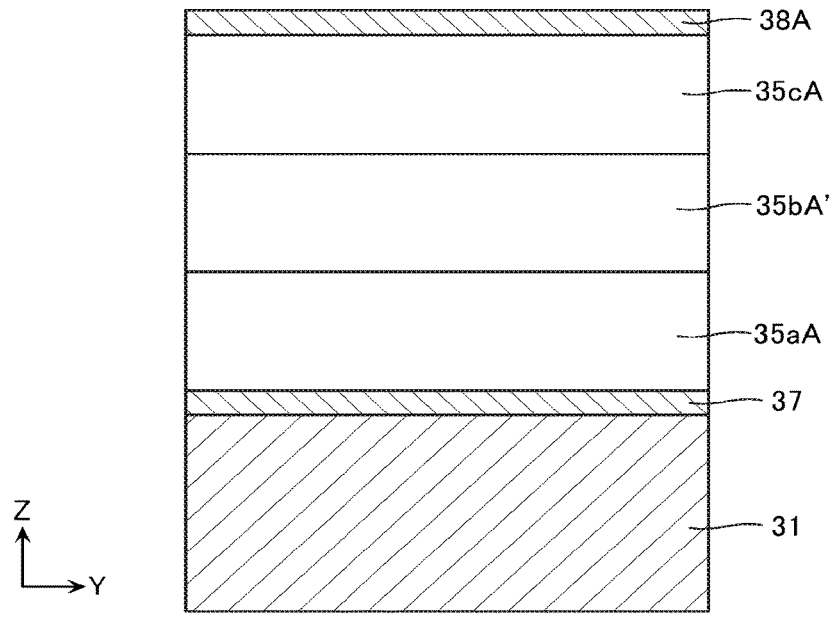
FIG. 36 is a cross-sectional view illustrating a method for manufacturing the semiconductor memory device.
Figure 37:
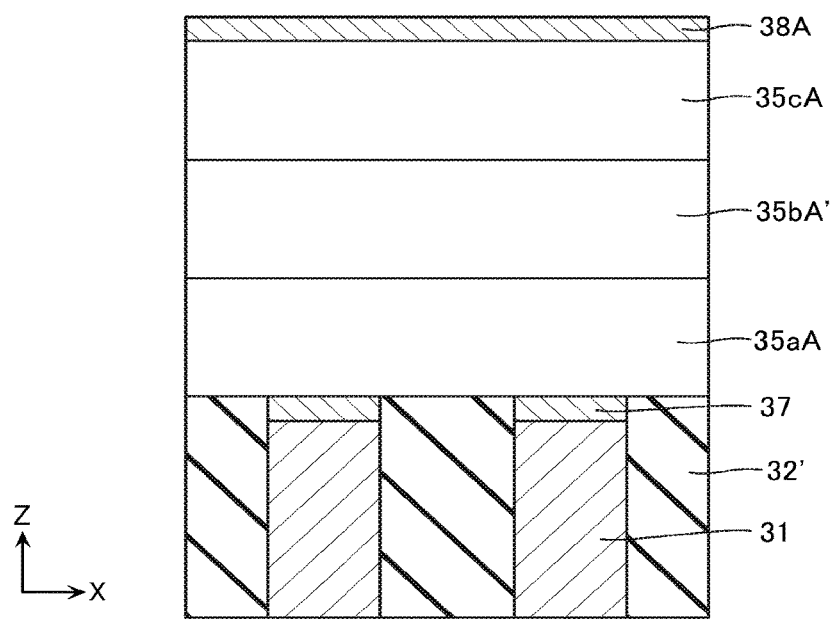
FIG. 37 is a cross-sectional view illustrating a method for manufacturing the semiconductor memory device.

Next, as illustrated in FIG. 36 and FIG. 37, the semiconductor layer 35aA, a semiconductor layer 35bA', the semiconductor layer 35cA, and the conducting layer 38A are laminated on the top surfaces of the conducting layers 37 and the insulating layers 32'.

Figure 38:
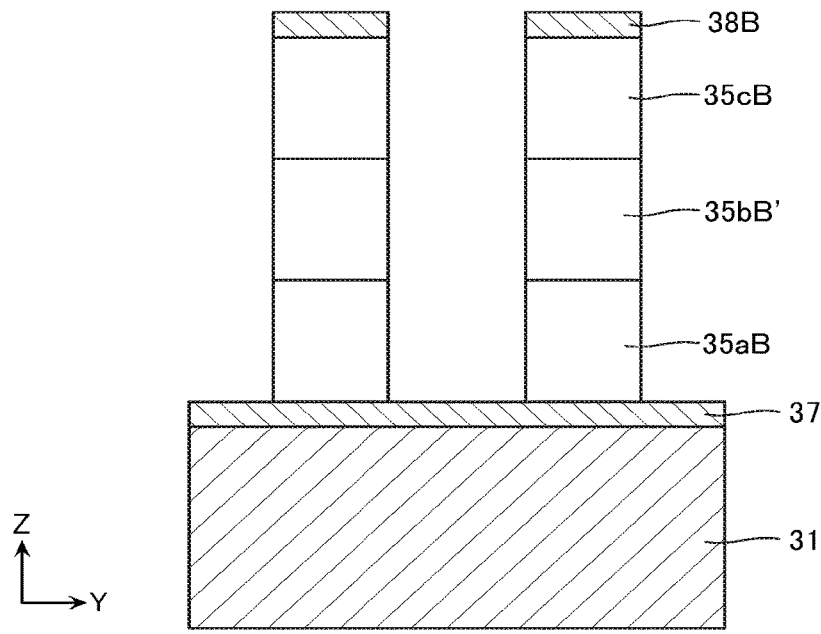
FIG. 38 is a cross-sectional view illustrating a method for manufacturing the semiconductor memory device.
Figure 39:
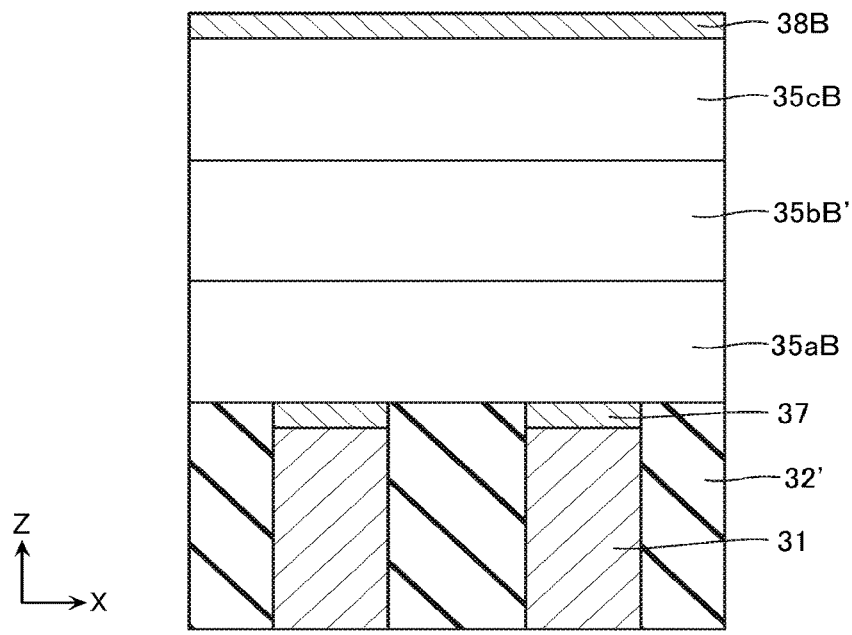
FIG. 39 is a cross-sectional view illustrating a method for manufacturing the semiconductor memory device.
Figure 40:
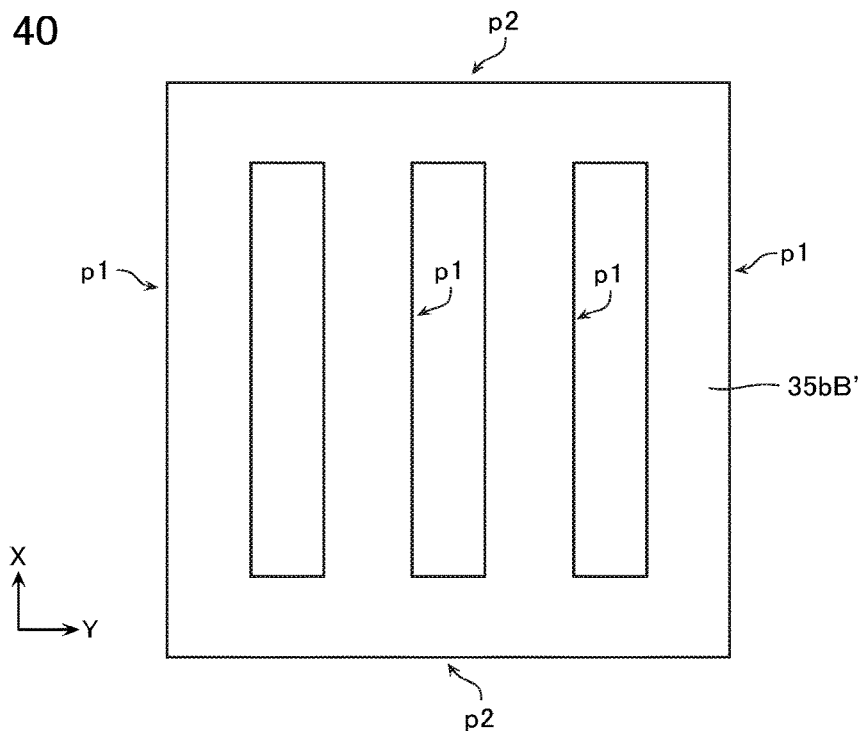
FIG. 40 is a cross-sectional view illustrating a method for manufacturing the semiconductor memory device.

Next, as illustrated in FIG. 38 to FIG. 40, the semiconductor layer 35aA, the semiconductor layer 35bA', the semiconductor layer 35cA, and the conducting layer 38A are separated in the Y direction to forma semiconductor layer 35aB, a semiconductor layer 35bB', a semiconductor layer 35cB, and a conducting layer 38B. This process, for example, patterns a resist (not illustrated) or a similar member by the PEP. Using this resist or a similar member as a mask, the RIE is performed. As illustrated in FIG. 40, the semiconductor layer 35aB, the semiconductor layer 35bB', the semiconductor layer 35cB, and the conducting layer 38B may be formed so as to include a plurality of first parts p1 and a pair of second parts p2. The first parts p1 extend in the X direction and are disposed in the Y direction. The second parts p2 extend in the Y direction and are connected to one ends and the other ends of these plurality of first parts p1. A part of the first part p1 forms the semiconductor layer 35'. The second parts p2 prevent the first parts p1 from collapsing in the Y direction.

Figure 41:
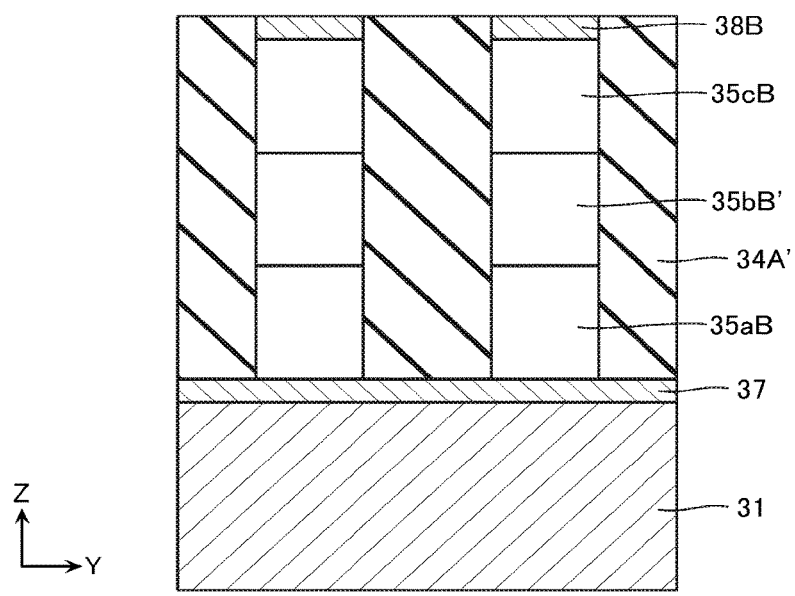
FIG. 41 is a cross-sectional view illustrating a method for manufacturing the semiconductor memory device.

Next, as illustrated in FIG. 41, insulating layers 34A', which will be insulating layers 34', are embedded into regions between the semiconductor layers 35aB, the semiconductor layers 35bB', the semiconductor layers 35cB, and the conducting layers 38B. The insulating layer 34A' may be flattened by means such as the CMP. In this case, for example, the conducting layer 38B can serve as a stopper.

Figure 42:
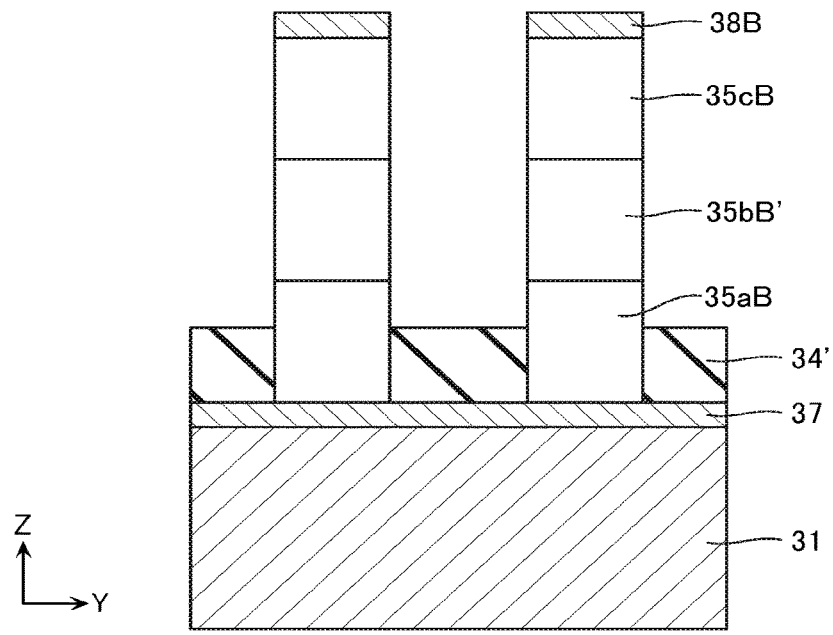
FIG. 42 is a cross-sectional view illustrating a method for manufacturing the semiconductor memory device.

Next, as illustrated in FIG. 42, the insulating layers 34A' are partially removed to lower the top surfaces, thus forming the insulating layers 34'. In this respect, the height of the top surface of the insulating layer 34' is adjusted so as to be lower than the height of the lower surface of the semiconductor layer 35bB'. This process is performed by means such as the RIE.

Figure 43:
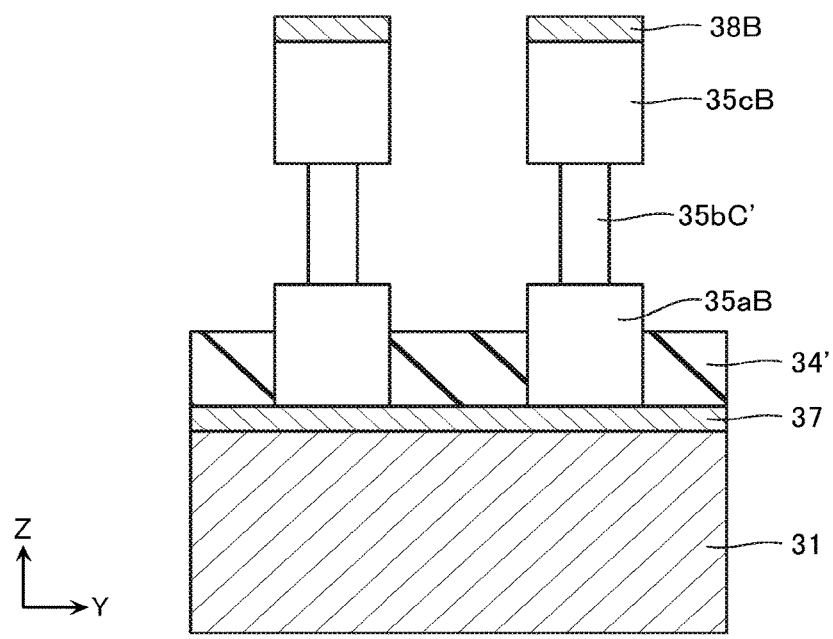
FIG. 43 is a cross-sectional view illustrating a method for manufacturing the semiconductor memory device.
Figure 44:
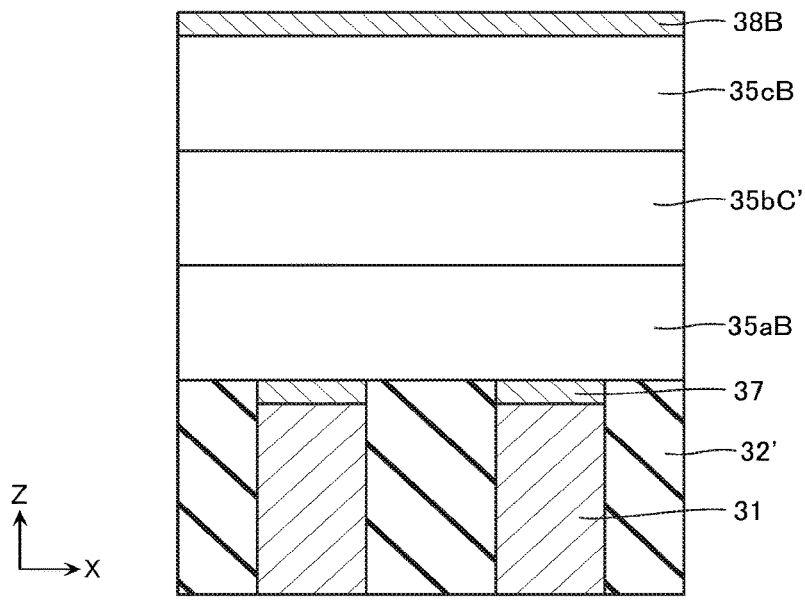
FIG. 44 is a cross-sectional view illustrating a method for manufacturing the semiconductor memory device.
Figure 45:
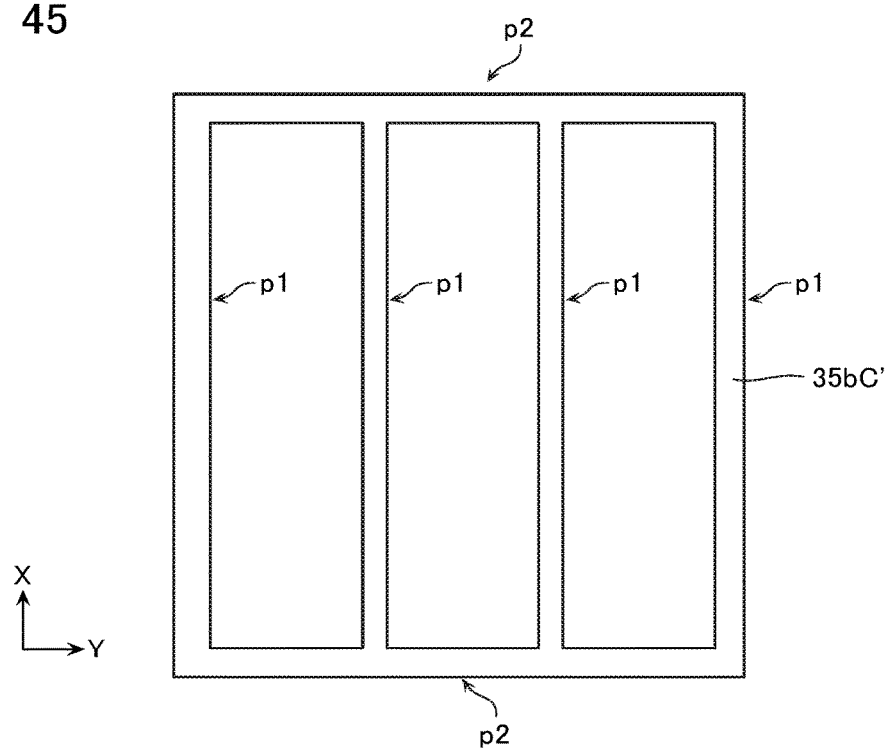
FIG. 45 is a cross-sectional view illustrating a method for manufacturing the semiconductor memory device.

Next, as illustrated in FIG. 43 to FIG. 45, the width of the first part p1 of the semiconductor layer 35bB' in the Y direction is designed to be smaller than the widths of the semiconductor layer 35aB and the semiconductor layer 35cB. This process forms an intermediate-layer semiconductor layer 35bC'. This process can be performed similar to the first embodiment.

Figure 46:
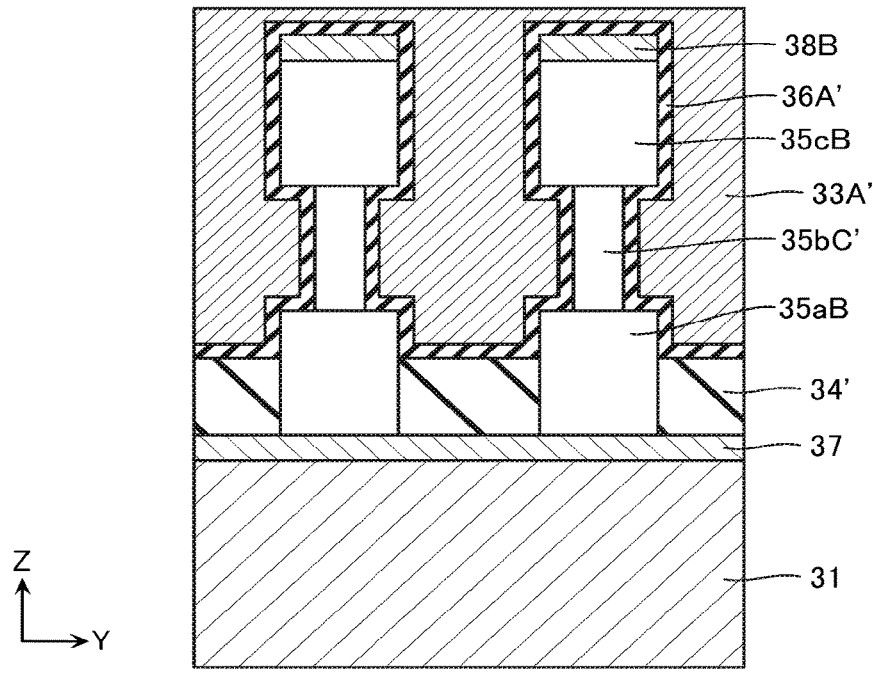
FIG. 46 is a cross-sectional view illustrating a method for manufacturing the semiconductor memory device.
Figure 47:
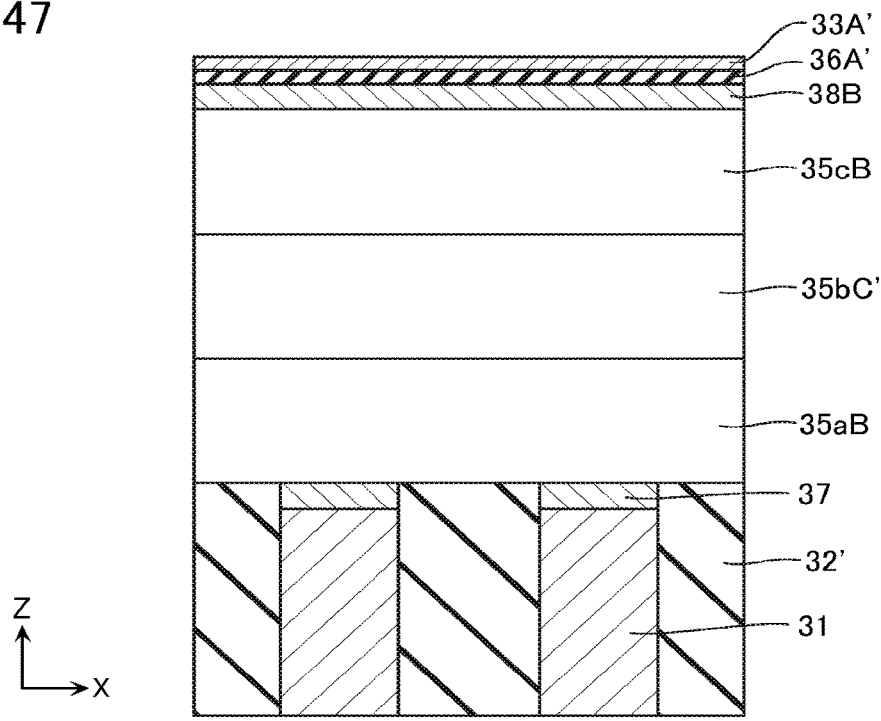
FIG. 47 is a cross-sectional view illustrating a method for manufacturing the semiconductor memory device.

Next, as illustrated in FIG. 46 and FIG. 47, an insulating layer 36A', which will be an insulating layer 36', is formed over the side surfaces of the semiconductor layers 35aB, the semiconductor layers 35bC', the semiconductor layers 35cB, and the conducting layers 38B, and the top surfaces of the conducting layers 38B. As illustrated in FIG. 46 and FIG. 47, a conducting layer 33A', which will be the conducting layer 33', is embedded. In this respect, the top surface of the conducting layer 33A' may be flattened by means such as CMP.

Figure 48:
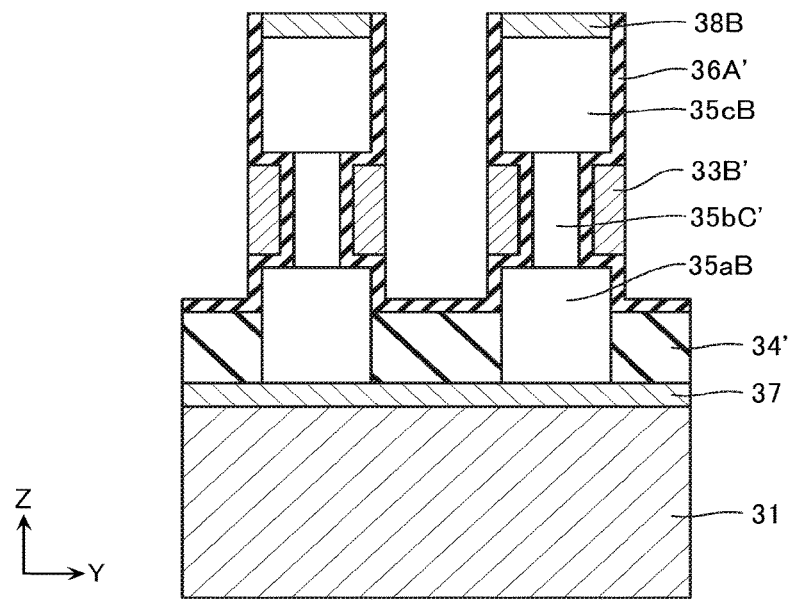
FIG. 48 is a cross-sectional view illustrating a method for manufacturing the semiconductor memory device.
Figure 49:
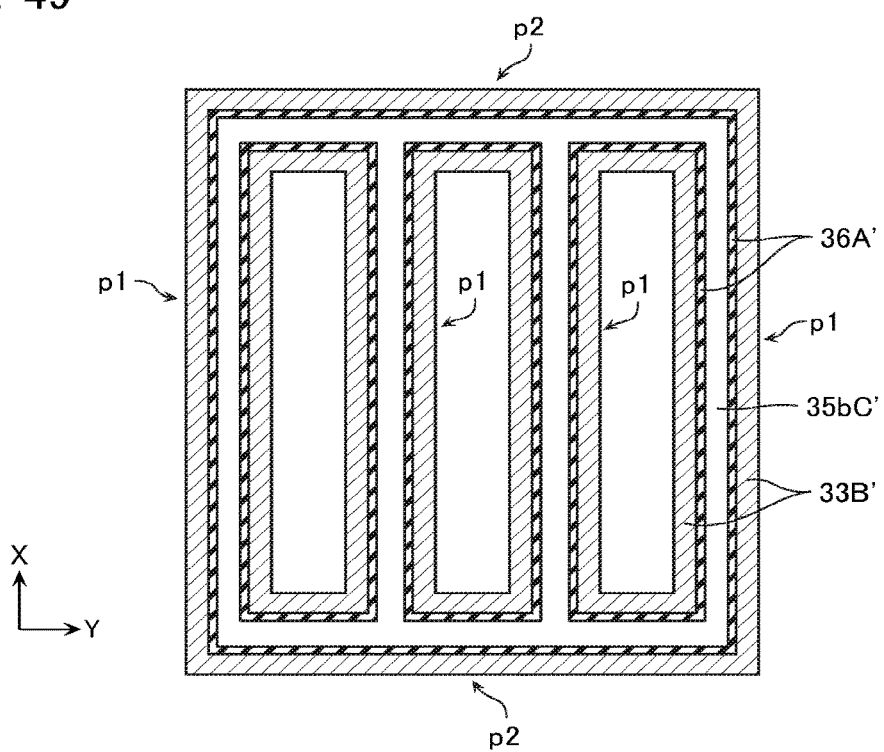
FIG. 49 is a cross-sectional view illustrating a method for manufacturing the semiconductor memory device.

Next, as illustrated in FIG. 48 and FIG. 49, the conducting layer 33A' is partially removed to form conducting layers 33B'. This process, for example, forms a mask material (not illustrated) by the PEP. The conducting layer 33A' is partially removed by the RIE.

Figure 50:
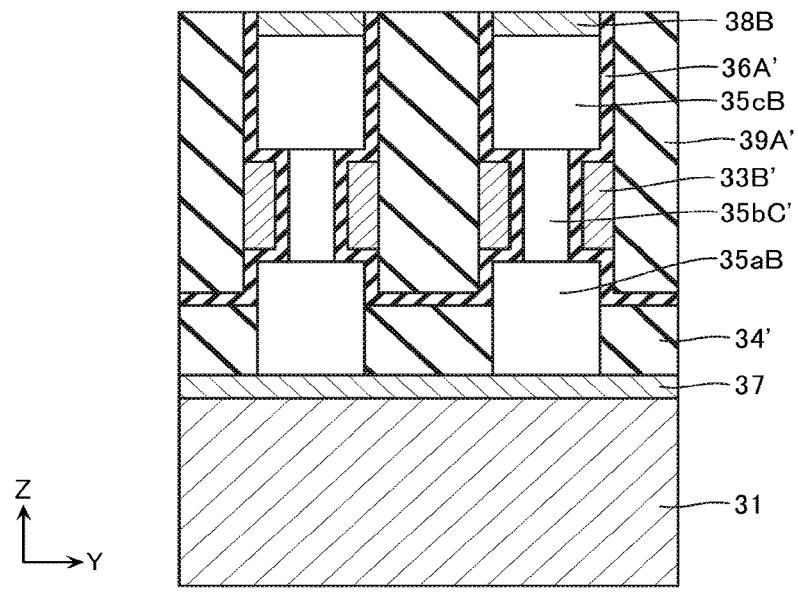
FIG. 50 is a cross-sectional view illustrating a method for manufacturing the semiconductor memory device.
Figure 51:
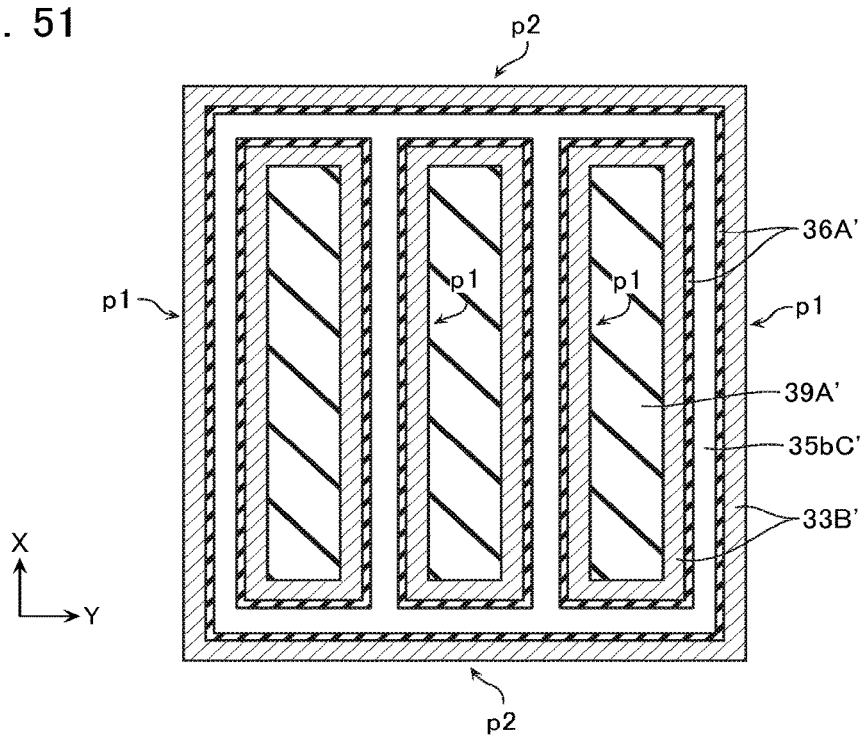
FIG. 51 is a cross-sectional view illustrating a method for manufacturing the semiconductor memory device.

Next, as illustrated in FIG. 50 and FIG. 51, insulating layers 39A' are embedded into sidewalls of the insulating layers 36A' and the conducting layers 33B'.

Figure 52:
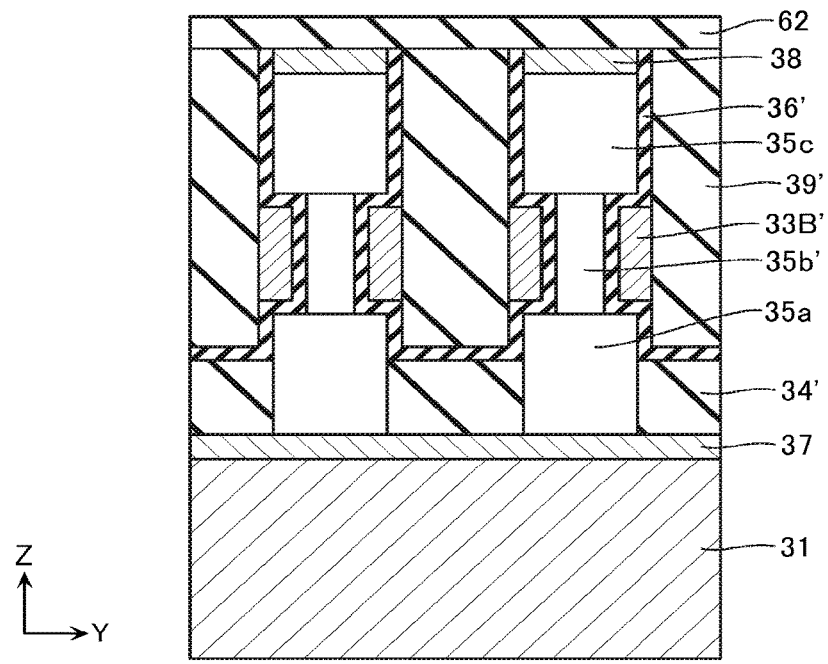
FIG. 52 is a cross-sectional view illustrating a method for manufacturing the semiconductor memory device.
Figure 53:
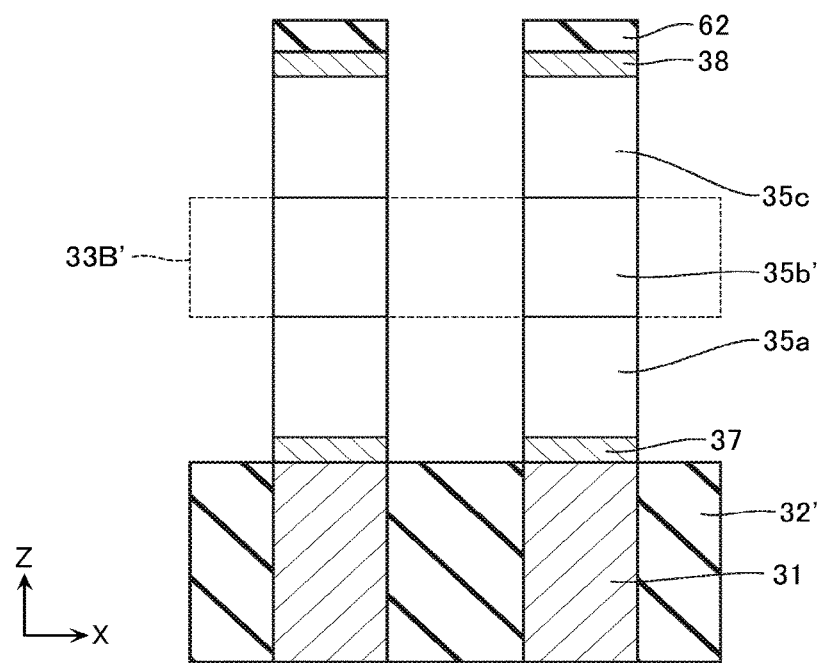
FIG. 53 is a cross-sectional view illustrating a method for manufacturing the semiconductor memory device.
Figure 54:
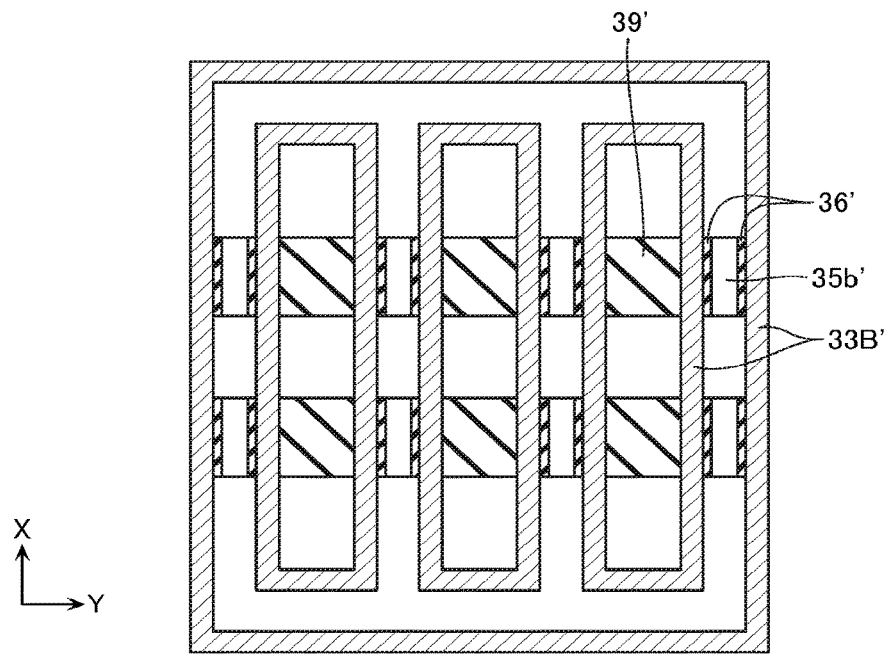
FIG. 54 is a cross-sectional view illustrating a method for manufacturing the semiconductor memory device.

Next, as illustrated in FIG. 52 to FIG. 54, a mask material 62 extending in the Y direction is formed. The semiconductor layers 35aB, the semiconductor layers 35bC', the semiconductor layers 35cB, the conducting layers 38B, and the insulating layers 36A' are separated in the X direction. Thus, the lower-layer semiconductor layers 35a, the intermediate-layer semiconductor layers 35b', the upper-layer semiconductor layers 35c, the conducting layers 38, and the insulating layers 36' are formed. Here, in the case where the conducting layer 33B' is made of the metallic material such as tungsten (W) and the respective layers are separated in the X direction by means such as etching, the separation of the conducting layer 33B' in the X direction can be preferably prevented. In the lower-layer semiconductor layer 35a, parts positioned immediately below the conducting layers 33B' can be preferably removed by performing the isotropic etching.

Figure 55:
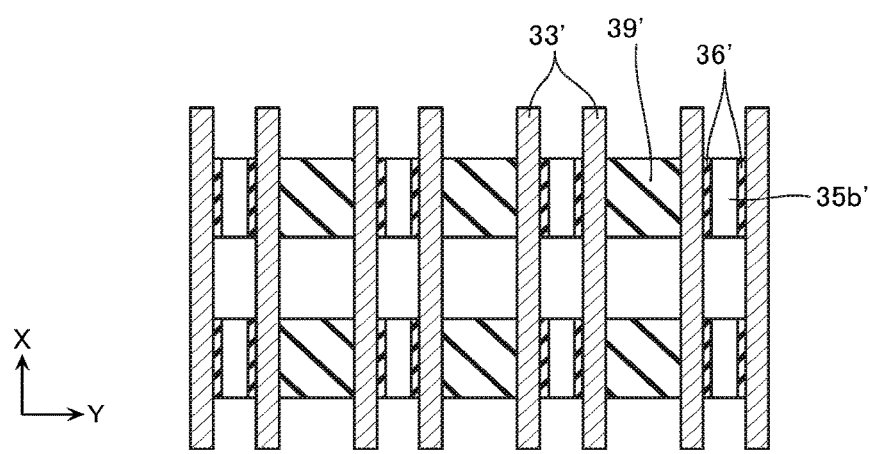
FIG. 55 is a cross-sectional view illustrating a method for manufacturing the semiconductor memory device.

Next, as illustrated in FIG. 55, in the conducting layer 33B', parts extending in the Y direction are removed, thus forming conducting layers 33'. Next, as illustrated in FIG. 30, insulating layers 39" are embedded, thus allowing manufacturing the selection transistor layer 30' according to the embodiment. Further, the conducting layers and the insulating layers are laminated in alternation on the upper layer of this selection transistor layer 30. The laminated layers are separated in the Y direction to form trenches. The variable resistance layers 44 and the columnar-shaped conducting layers 43 are formed in these trenches. Thus, the semiconductor memory device according to the embodiment can be manufactured.

That is, the manufacturing method according to the embodiment forms the semiconductor layer 35aB, the semiconductor layer 35bB', the semiconductor layer 35cB, and the conducting layer 38B so as to include the plurality of first parts and the second part. The first parts extend in the X direction and are disposed in the Y direction. The second part extends in the Y direction and is connected to the one ends of these plurality of first parts. This preferably prevents the pattern from collapsing, allowing preferably manufacturing the semiconductor memory device according to the embodiment.

[Other Embodiments]

The first and second embodiments describe the example where the selection transistor layer 30 or the selection transistor layer 30' is used in combination with the memory layer 40. However, the selection transistor layer 30 and the selection transistor layer 30' can also be used in combination with the structure other than the memory layer 40. In this case as well, for example, the lower-layer semiconductor layer 35a is connected to the lower-layer electrode positioned below this lower-layer semiconductor layer 35a. The upper-layer semiconductor layer 35c is connected to the upper-layer electrode positioned on this upper-layer semiconductor layer 35c. In the first and second embodiments, the conducting layer 31, which operates as the global bit line GBL, corresponds to the lower-layer electrode. Further, the conducting layer 43, which operates as the bit line BL, corresponds to the upper-layer electrode. With the first and second embodiments, the lower-layer electrode extends in the Y direction while the upper-layer electrode extends in the Z direction. However, the directions that the lower-layer electrode and the upper-layer electrode extend can be appropriately changed. One of the lower-layer electrode and the upper-layer electrode may be connected in common to the plurality of transistors and the other may be independently connected. With such structure, one or a plurality of wirings are selected from the wirings independently connected to the plurality of transistors, and the wirings can be preferably connected to the wiring connected in common. For example, assume the case where the gate electrode extends in the X direction, one of the lower-layer electrode and the upper-layer electrode extends in the Y direction while the other extends in the Z direction. The plurality of selection transistors disposed in the X direction can be selectively set to an ON state. The upper-layer electrodes connected to these selection transistors can be connected to the lower-layer electrodes.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of first wirings disposed in a first direction along a surface of a substrate and in a second direction intersecting with the surface of the substrate, the first wirings extending in a third direction intersecting with the first direction and the second direction;
a plurality of second wirings disposed in the first direction, the second wirings extending in the second direction, the second wirings intersecting with the first wirings;
a plurality of memory cells disposed at portions where the first wirings intersect with the second wirings;
a plurality of selection gate transistors connected to respective one ends of the second wirings; and
a third wiring connected in common to one ends of the selection gate transistors, wherein
the selection gate transistor includes:
a first semiconductor layer, a second semiconductor layer, and a third semiconductor layer laminated in an order on the third wiring; and
a gate electrode at least opposed to a side surface of the second semiconductor layer in the first direction, and
the second semiconductor layer has a length in the first direction smaller than lengths of the first semiconductor layer and the third semiconductor layer in the first direction.

2. The semiconductor memory device according to claim 1, wherein
the gate electrode is opposed to both side surfaces of the second semiconductor layer in the first direction and both side surfaces in the third direction.

3. The semiconductor memory device according to claim 1, wherein
the gate electrode includes two conducting layers, the conducting layers being separated in the first direction,
one of the two conducting layers is opposed to one side surface of the second semiconductor layer in the first direction, and
another conducting layer among the two conducting layers is opposed to another side surface of the second semiconductor layer in the first direction.

4. The semiconductor memory device according to claim 1, wherein
the gate electrode is opposed to a top surface of the first semiconductor layer at a lower surface thereof, and
the gate electrode is opposed to a lower surface of the third semiconductor layer at a top surface thereof.

5. The semiconductor memory device according to claim 1, wherein
the first semiconductor layer and the third semiconductor layer are N type semiconductor layers, and
the second semiconductor layer is a P type semiconductor layer.

6. The semiconductor memory device according to claim 1, wherein
the first semiconductor layer and the third semiconductor layer are P type semiconductor layers, and
the second semiconductor layer is an N type semiconductor layer.

7. The semiconductor memory device according to claim 1, wherein
the first semiconductor layer and the third semiconductor layer are N type semiconductor layers, and
the second semiconductor layer is an oxide semiconductor layer.

8. A semiconductor device comprising:
a lower-layer electrode formed on a substrate;
an upper-layer electrode positioned over the lower-layer electrode; and
a transistor connected to the lower-layer electrode and the upper-layer electrode, wherein the transistor includes:
a first semiconductor layer, a second semiconductor layer, and a third semiconductor layer laminated in an order on the lower-layer electrode; and
a gate electrode at least opposed to the second semiconductor layer in a first direction,
the second semiconductor layer has a width in the first direction smaller than lengths of the first semiconductor layer and the third semiconductor layer in the first direction,
the gate electrode includes two conducting layers, the conducting layers being separated in the first direction,
one of the two conducting layers is opposed to one side surface of the second semiconductor layer in the first direction, and
another conducting layer among the two conducting layers is opposed to another side surface of the second semiconductor layer in the first direction.

9. The semiconductor device according to claim 8, further comprising
a plurality of the transistors disposed in the first direction, wherein
a plurality of the gate electrodes are separated in the first direction,
one of the lower-layer electrode and the upper-layer electrode is connected in common to the plurality of transistors, and
another of the lower-layer electrode and the upper-layer electrode is independently connected to the plurality of transistors.

10. The semiconductor device according to claim 8, wherein
the gate electrode is opposed to a top surface of the first semiconductor layer at a lower surface thereof, and
the gate electrode is opposed to a lower surface of the third semiconductor layer at a top surface thereof.

11. The semiconductor device according to claim 8, wherein
the first semiconductor layer and the third semiconductor layer are N type semiconductor layers, and
the second semiconductor layer is a P type semiconductor layer.

12. The semiconductor device according to claim 8, wherein
the first semiconductor layer and the third semiconductor layer are P type semiconductor layers, and
the second semiconductor layer is an N type semiconductor layer.

13. The semiconductor device according to claim 8, wherein
the first semiconductor layer and the third semiconductor layer are N type semiconductor layers, and
the second semiconductor layer is an oxide semiconductor layer.

14. A semiconductor device comprising:
a lower-layer electrode formed on a substrate;
an upper-layer electrode positioned over the lower-layer electrode; and
a transistor connected to the lower-layer electrode and the upper-layer electrode, wherein
the transistor includes:
a first semiconductor layer, a second semiconductor layer, and a third semiconductor layer laminated in an order on the lower-layer electrode; and
a gate electrode at least opposed to the second semiconductor layer in a first direction,
the second semiconductor layer has a width in the first direction smaller than lengths of the first semiconductor layer and the third semiconductor layer in the first direction,
the gate electrode is opposed to a top surface of the first semiconductor layer at a lower surface thereof, and
the gate electrode is opposed to a lower surface of the third semiconductor layer at a top surface thereof.

15. The semiconductor device according to claim 14, further comprising
a plurality of the transistors disposed in the first direction, wherein
a plurality of the gate electrodes are separated in the first direction,
one of the lower-layer electrode and the upper-layer electrode is connected in common to the plurality of transistors, and
another of the lower-layer electrode and the upper-layer electrode is independently connected to the plurality of transistors.

16. The semiconductor device according to claim 14, wherein
the gate electrode is opposed to both side surfaces of the second semiconductor layer in the first direction and both side surfaces in a second direction, the second direction intersecting with the first direction.

17. The semiconductor device according to claim 14, wherein
the first semiconductor layer and the third semiconductor layer are N type semiconductor layers, and
the second semiconductor layer is a P type semiconductor layer.

18. The semiconductor device according to claim 14, wherein
the first semiconductor layer and the third semiconductor layer are P type semiconductor layers, and
the second semiconductor layer is an N type semiconductor layer.

19. The semiconductor device according to claim 14, wherein
the first semiconductor layer and the third semiconductor layer are N type semiconductor layers, and
the second semiconductor layer is an oxide semiconductor layer.

20. A semiconductor device comprising:
a lower-layer electrode formed on a substrate;
an upper-layer electrode positioned over the lower-layer electrode; and
a transistor connected to the lower-layer electrode and the upper-layer electrode, wherein
the transistor includes:
a first semiconductor layer, a second semiconductor layer, and a third semiconductor layer laminated in an order on the lower-layer electrode; and
a gate electrode at least opposed to the second semiconductor layer in a first direction,
the second semiconductor layer has a width in the first direction smaller than lengths of the first semiconductor layer and the third semiconductor layer in the first direction,
the first semiconductor layer and the third semiconductor layer are N type semiconductor layers, and
the second semiconductor layer is an oxide semiconductor layer.

21. The semiconductor device according to claim 20, further comprising a plurality of the transistors disposed in the first direction, wherein a plurality of the gate electrodes are separated in the first direction, one of the lower-layer electrode and the upper-layer electrode is connected in common to the plurality of transistors, and another of the lower-layer electrode and the upper-layer electrode is independently connected to the plurality of transistors.

22. The semiconductor device according to claim 20, wherein the gate electrode is opposed to both side surfaces of the second semiconductor layer in the first direction and both side surfaces in a second direction, the second direction intersecting with the first direction.

\* \* \* \* \*